United States Patent
Kim et al.

(10) Patent No.: US 8,609,449 B2
(45) Date of Patent: Dec. 17, 2013

(54) METHOD OF FABRICATING SEMICONDUCTOR SUBSTRATE AND METHOD OF FABRICATING LIGHT EMITTING DEVICE

(71) Applicant: Seoul Opto Device Co., Ltd., Ansan-si (KR)

(72) Inventors: Chang Youn Kim, Ansan-si (KR); Shiro Sakai, Tokushima (JP); Hwa Mok Kim, Ansan-si (KR); Joon Hee Lee, Ansan-si (KR); Soo Young Moon, Ansan-si (KR); Kyoung Wan Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/694,058

(22) Filed: Oct. 25, 2012

(65) Prior Publication Data

US 2013/0109121 A1     May 2, 2013

Related U.S. Application Data

(63) Continuation of application No. 13/506,295, filed on Apr. 10, 2012, now Pat. No. 8,329,488, which is a continuation of application No. 13/137,124, filed on Jul. 21, 2011, now Pat. No. 8,183,075, which is a continuation of application No. 12/805,958, filed on Aug. 26, 2010, now Pat. No. 8,026,119.

(30) Foreign Application Priority Data

| Aug. 26, 2009 | (KR) | 10-2009-0079429 |
| Aug. 26, 2009 | (KR) | 10-2009-0079431 |
| Aug. 26, 2009 | (KR) | 10-2009-0079434 |
| Aug. 26, 2009 | (KR) | 10-2009-0079436 |

(51) Int. Cl.
*H01L 33/06* (2010.01)

(52) U.S. Cl.
USPC ............................................. 438/47

(58) Field of Classification Search
USPC ....................................... 438/46, 47
See application file for complete search history.

(56) References Cited

U.S. PATENT DOCUMENTS

| 6,024,884 A | 2/2000 | Bryant et al. |
| 6,294,475 B1 | 9/2001 | Schubert et al. |

(Continued)

FOREIGN PATENT DOCUMENTS

| JP | 2004-026624 | 1/2004 |
| JP | 2005-057220 | 3/2005 |

(Continued)

OTHER PUBLICATIONS

PCT Search Report dated Feb. 24, 2011 on PCT Application No. PCT/KR2010/004816, which corresponds to U.S. Appl. No. 12/059,958.

(Continued)

*Primary Examiner* — Thao P. Le
(74) *Attorney, Agent, or Firm* — H.C. Park & Associates, PLC

(57) ABSTRACT

The present invention provides a method of fabricating a semiconductor substrate and a method of fabricating a light emitting device. The method includes forming a first semiconductor layer on a substrate, forming a metallic material layer on the first semiconductor layer, forming a second semiconductor layer on the first semiconductor layer and the metallic material layer, wherein a void is formed in a first portion of the first semiconductor layer under the metallic material layer during formation of the second semiconductor layer, and separating the substrate from the second semiconductor layer by etching at least a second portion of the first semiconductor layer using a chemical solution.

19 Claims, 15 Drawing Sheets
(6 of 15 Drawing Sheet(s) Filed in Color)

(56) References Cited

U.S. PATENT DOCUMENTS

| | | | |
|---|---|---|---|
| 7,196,399 | B2 | 3/2007 | Usui et al. |
| 7,230,282 | B2 | 6/2007 | Shibata |
| 7,364,991 | B2 * | 4/2008 | Bour et al. ............. 438/483 |
| 7,435,608 | B2 | 10/2008 | Shibata |
| 7,470,599 | B2 * | 12/2008 | Nijhawan et al. ............. 438/457 |
| 7,642,112 | B2 | 1/2010 | Atoji et al. |
| 8,026,119 | B2 | 9/2011 | Kim et al. |
| 8,053,811 | B2 | 11/2011 | Hiramatsu et al. |
| 8,198,179 | B2 * | 6/2012 | Sasaki et al. ............. 438/485 |
| 2001/0053618 | A1 | 12/2001 | Kozaki et al. |
| 2002/0197825 | A1 | 12/2002 | Usui et al. |
| 2003/0047746 | A1 | 3/2003 | Kuniyasu et al. |
| 2003/0143771 | A1 | 7/2003 | Kidoguchi et al. |
| 2003/0183157 | A1 | 10/2003 | Usui et al. |
| 2004/0021147 | A1 | 2/2004 | Ishibashi et al. |
| 2004/0206967 | A1 | 10/2004 | Oshima et al. |
| 2004/0209442 | A1 | 10/2004 | Takakuwa et al. |
| 2005/0077512 | A1 | 4/2005 | Yoon et al. |
| 2005/0194564 | A1 | 9/2005 | Fujita et al. |
| 2006/0006408 | A1 | 1/2006 | Suehiro et al. |
| 2006/0151797 | A1 | 7/2006 | Park |
| 2006/0151801 | A1 | 7/2006 | Doan et al. |
| 2007/0243702 | A1 * | 10/2007 | Nijhawan et al. ............. 438/602 |
| 2008/0014723 | A1 | 1/2008 | Shibata |
| 2008/0251803 | A1 | 10/2008 | Cho et al. |
| 2008/0296586 | A1 | 12/2008 | Francis et al. |
| 2009/0093122 | A1 | 4/2009 | Ueda et al. |
| 2009/0098677 | A1 | 4/2009 | Shibata |
| 2009/0130853 | A1 | 5/2009 | Chou et al. |
| 2009/0280625 | A1 | 11/2009 | Lin et al. |
| 2010/0015739 | A1 | 1/2010 | Park |
| 2010/0139758 | A1 | 6/2010 | Chang et al. |
| 2010/0219436 | A1 | 9/2010 | Watanabe |
| 2010/0252859 | A1 | 10/2010 | Son |
| 2010/0314661 | A1 | 12/2010 | Sakai |
| 2010/0320506 | A1 | 12/2010 | Varangis et al. |
| 2011/0053303 | A1 | 3/2011 | Kim et al. |

FOREIGN PATENT DOCUMENTS

| | | |
|---|---|---|
| JP | 2005-064247 | 3/2005 |
| JP | 2005-085851 | 3/2005 |
| KR | 10-2002-0010583 | 2/2002 |
| KR | 10-2003-0030019 | 4/2003 |
| KR | 10-2003-0032965 | 4/2003 |
| KR | 10-2005-0035565 | 4/2005 |
| KR | 10-2006-0081107 | 7/2006 |
| KR | 10-2006-0135568 | 12/2006 |
| KR | 10-2007-0005984 | 1/2007 |
| KR | 10-2007-0009854 | 1/2007 |
| KR | 10-2007-0101424 | 10/2007 |
| KR | 10-2008-0093222 | 10/2008 |
| KR | 10-2008-0100466 | 11/2008 |
| WO | 03/098710 | 11/2003 |

OTHER PUBLICATIONS

Hasegawa, et al., "Polycrystalline GaN for light emitter and field electron emitter applications" Thin Solid Films 487 (2005), pp. 260-267.

International Search Report of PCT/KR2010/003724 issued on Jan. 14, 2011, corresponding to U.S. Appl. No. 12/801,455.

M. Haino, et al. "Buried Tungsten Metal Structure Fabricated by Epitaxial-Lateral-Overgrown GaN via Low-Pressure Metalorganic Vapor Phase Epitaxy" Japan Journal of Applied Physics, 39 (2000) pp. 449-452.

Written Opinion of PCT/KR2010/003724 issued on Jan. 14, 2011, corresponding to U.S. Appl. No. 12/801,455.

Notice of Allowance dated May 27, 2011, issued for related co-pending U.S. Appl. No. 12/805,958.

Non-Final Office Action of U.S. Appl. No. 13/137,124, dated Nov. 25, 2011.

Non-Final Office Action of U.S. Appl. No. 12/919,712, dated Dec. 2, 2011.

International Search Report of PCT/KR2011/000871 issued Sep. 28, 2011.

Non-Final Office Action of U.S. Appl. No. 12/650,276, dated Nov. 10, 2011.

Notice of Allowance of U.S. Appl. No. 12/805,958, dated Feb. 25, 2011.

Notice of Allowance of U.S. Appl. No. 13/137,124, dated Feb. 6, 2012.

Final Office Action of U.S. Appl. No. 12/929,712 dated Apr. 5, 2012.

Final Office Action of U.S. Appl. No. 12/650,276 dated Apr. 12, 2012.

Notice of Allowance issued for related U.S. Appl. No. 12/650,276 dated Jun. 25, 2012.

Notice of Allowance of U.S. Appl. No. 13/506,295 issued on Jul. 25, 2012.

Non-Final Office Action of U.S. Appl. No. 12/801,455 issued Aug. 29, 2012.

Non-Final Office Action of U.S. Appl. No. 12/875,649 dated Oct. 4, 2012.

Notice of Allowance dated Mar. 5, 2013 issued to related U.S. Appl. No. 12/929,712.

Final Office Action of U.S. Appl. No. 12/801,455 dated Nov. 23, 2012.

Non-Final Office Action of U.S. Appl. No. 12/929,712 dated Nov. 28, 2012.

Non-Final Office Action issued to U.S. Appl. No. 13/507,210 dated Apr. 30, 2013.

Notice of Allowance issued on Jul. 29, 2013 in U.S. Appl. No. 12/875,649.

* cited by examiner

SEM cross-section of enlarged area

Ga EDX diagram

Al EDX diagram

O EDX diagram

SEM cross-section of substrate

SEM surface photograph of substrate

Ga EDX diagram

Ta EDX diagram

SEM perspective view of substrate

SEM surface photograph of substrate

SEM cross-section of void

EDX spectrum diagram

Cutting position

SEM cross-section of substrate having Ta layer of 30 nm

SEM cross-section of
substrate having Ta layer of 50 nm

SEM cross-section of
substrate having Ta layer of 100 nm

METHOD OF FABRICATING SEMICONDUCTOR SUBSTRATE AND METHOD OF FABRICATING LIGHT EMITTING DEVICE

CROSS-REFERENCE TO RELATED APPLICATIONS

This application is a continuation of U.S. patent application Ser. No. 13/506,295, filed on Apr. 10, 2012, which is a continuation of U.S. patent application Ser. No. 13/137,124, filed on Jul. 21, 2011, and now issued as U.S. Pat. No. 8,183,075, which is a continuation of U.S. patent application Ser. No. 12/805,958, filed on Aug. 26, 2010, and now issued as U.S. Pat. No. 8,026,119, and claims priority from and the benefit of Korean Patent Application No. 10-2009-0079429, filed on Aug. 26, 2009, Korean Patent Application No. 10-2009-0079431, filed on Aug. 26, 2009, Korean Patent Application No. 10-2009-0079434, filed on Aug. 26, 2009, and Korean Patent Application No. 10-2009-0079436, filed on Aug. 26, 2009, all of which are hereby incorporated by reference for all purposes as if fully set forth herein.

BACKGROUND

1. Field

The present invention relates to a method of fabricating a semiconductor substrate and a method of fabricating a light emitting device. More particularly, the present invention relates to a method of fabricating a semiconductor substrate and a method of fabricating a light emitting device based on separating a growth substrate.

2. Discussion of the Background

Light emitting diodes (LEDs) that have a gallium nitride (GaN) based semiconductor may be used for various applications, such as traffic signals, backlights in liquid crystal panels, and the like. It is known that luminous efficiency of an LED is influenced by the dislocation density of crystals and crystal defects. GaN-based semiconductor crystals may be grown on a heterogeneous substrate, such as sapphire or the like. However, lattice mismatch or a difference of thermal expansion coefficients may occur between a GaN layer and a substrate, which may result in a high dislocation density or an increase in defects.

The GaN-based semiconductor crystals may be grown on a homogeneous substrate, such as a GaN substrate and the like. However, it may be difficult to form a GaN melt and to fabricate a GaN substrate due to a high dissociation rate of nitrogen in GaN, and the like. A GaN bulk crystal grown for a GaN substrate may be separated by mechanical grinding or laser ablation. However, it may be difficult to produce a GaN substrate of a practical size using these methods. Particularly, the laser ablation method may require a considerable amount of time to perform, which may increase the cost of a GaN substrate.

GaN crystal growth is shown and described in "Polycrystalline GaN for light emitter and field electron emitter applications," by S. Hasegawa, S, Nishida, T. Yamashita, H. Asahi, (Thin Solid Films 487 (2005), pp 260-267) (hereinafter, "Hasegawa, et al."), which is hereby incorporated by reference in its entirety for all purposes as if fully set forth herein. In Hasegawa, et al., GaN crystals are grown on quartz substrates, high-melting-point metal substrates of Tungsten (W), Molybdenum (Mo), Tantalum (Ta) and Niobium (Nb), and Silicon (Si) substrates using plasma assisted molecular beam epitaxy, respectively.

Since it may be difficult and costly to fabricate the GaN substrate, semiconductor devices such as LEDs or laser diodes are generally manufactured by growing a GaN layer on a heterogeneous substrate such as sapphire and the like. However, as mentioned above, the high dislocation density or the increase in defect density may degrade the luminous efficiency of the LED. In addition, the sapphire substrate has a lower thermal conductivity than the GaN substrate, and may cause deterioration in heat dissipation properties of a device. Thus, use of a sapphire substrate for LEDs or laser diodes may limit operational lifespan thereof.

To solve such problems of the sapphire substrate, a laser lift-off process has been developed in which a secondary substrate is attached to a GaN layer after the GaN layer is grown on a heterogeneous substrate as a growth substrate. The secondary substrate in turn is locally decomposed from an interface between the sapphire substrate and the GaN layer by an excimer laser to remove the sapphire substrate. This process is used to fabricate a vertical-type light emitting device suitable for large size LEDs (i.e., a power chip) and the like.

As described above, however, separation of the growth substrate using the laser may require an extended processing time, thereby causing an increase in manufacturing costs of the light emitting device. Further, since it may be necessary to increase transmittance of the sapphire substrate to laser beams in order to radiate a laser beam through the sapphire substrate, it may be necessary to polish an exposed surface of the sapphire substrate, which may decrease a thickness of the sapphire substrate.

SUMMARY OF THE INVENTION

The present invention provides a method of fabricating a semiconductor substrate and a method of fabricating a light emitting device.

The present invention also provides a method of fabricating a flat and easily separable GaN substrate on a heterogeneous substrate at low cost.

The present invention also provides a light emitting device fabricated using the GaN substrate which may have improved performance or long operational lifespan.

Additional features of the invention will be set forth in the description which follows, and in part will be apparent from the description, or may be learned by practice of the invention.

The present invention discloses a method of fabricating a semiconductor substrate, the method including forming a first semiconductor layer on a substrate, forming a metallic material layer on the first semiconductor layer, forming a second semiconductor layer on the first semiconductor layer and the metallic material layer, wherein a void is formed in a first portion of the first semiconductor layer under the metallic material layer during formation of the second semiconductor layer, and separating the first substrate from the second semiconductor layer by etching at least a second portion of the first semiconductor layer using a chemical solution.

The present invention also discloses a method of fabricating a light emitting device, the method including forming a first semiconductor layer on a first substrate, forming a metallic material layer on the first semiconductor layer, forming a second semiconductor layer on the first semiconductor layer and the metallic material layer, wherein a void is formed in a first portion of the first semiconductor layer under the metallic material layer during formation of the second semiconductor layer, forming a first compound semiconductor layer on the second semiconductor layer, forming an active layer on the first compound semiconductor layer, forming a second compound semiconductor layer on the active layer, attaching a second substrate to the second compound semiconductor layer, and separating the first substrate from the second semiconductor layer by etching at least a second portion of the first semiconductor layer using a chemical solution.

The present invention also discloses a method of fabricating a semiconductor substrate, the method including forming a first semiconductor layer on a substrate, forming a metallic material layer on the first semiconductor layer, forming a second semiconductor layer on the first semiconductor layer and the metallic material layer, wherein a void is formed in a first portion of the first semiconductor layer under the metallic material layer during formation of the second semiconductor layer, and growing the void in the first semiconductor layer by heating the substrate after forming the second semiconductor layer.

The present invention also discloses a method of fabricating a light emitting device, the method including forming a first semiconductor layer on a first substrate, forming a metallic material layer on the first semiconductor layer, forming a second semiconductor layer on the first semiconductor layer and the metallic material layer, wherein a void is formed in a first portion of the first semiconductor layer under the metallic material layer during formation of the second semiconductor layer, forming a first compound semiconductor layer on the second semiconductor layer, forming an active layer on the first compound semiconductor layer, forming a second compound semiconductor layer on the active layer, attaching a second substrate to the second compound semiconductor layer, and growing the void in the first semiconductor layer by heating the first substrate after attaching the second substrate.

The present invention also discloses a method of fabricating a semiconductor substrate, the method including forming a first semiconductor layer on a substrate, forming a metallic material layer on the first semiconductor layer, forming a second semiconductor layer on the first semiconductor layer and the metallic material layer, wherein a void is formed in a first portion of the first semiconductor layer under the metallic material layer during formation of the second semiconductor layer, and evaporating reaction by-products of the metallic material layer and nitrogen to remove the reaction by-products formed during formation of the void.

The present invention also discloses a method of fabricating a light emitting device, the method including forming a first semiconductor layer on a substrate, forming a metallic material layer on the first semiconductor layer, forming a second semiconductor layer on the first semiconductor layer and the metallic material layer, wherein a void is formed in a first portion of the first semiconductor layer under the metallic material layer during formation of the second semiconductor layer, forming a first compound semiconductor layer on the second semiconductor layer, forming an active layer on the first compound semiconductor layer, forming a second compound semiconductor layer on the active layer, and evaporating reaction by-products of the metallic material layer and nitrogen to remove the reaction by-products during formation of the void.

The present invention also discloses a method of fabricating a light emitting device, the method including forming, in a first chamber, a second semiconductor layer on a substrate including a first semiconductor layer and a metallic material layer on the first semiconductor layer, wherein a void is formed in a first portion of the first semiconductor layer under the metallic material layer during formation of the second semiconductor layer; transferring the substrate having the second semiconductor layer from the first chamber to a second chamber; and forming, in the second chamber, a compound semiconductor layer on the second semiconductor layer.

It is to be understood that both the foregoing general description and the following detailed description are exemplary and explanatory and are intended to provide further explanation of the invention as claimed.

BRIEF DESCRIPTION OF THE DRAWINGS

The patent or application file contains at least one drawing executed in color. Copies of this patent or patent application publication with color drawings will be provided by the Office upon request and payment of the necessary fee.

The accompanying drawings, which are included to provide a further understanding of the invention and are incorporated in and constitute a part of this specification, illustrate embodiments of the invention, and together with the description serve to explain the principles of the invention.

FIG. 1(A), FIG. 1(B), FIG. 1(C), FIG. 1(D), FIG. 1(E), and FIG. 1(F) illustrate a flow diagram of a method of fabricating a semiconductor substrate in accordance with a first exemplary embodiment of the present invention, in which FIG. 1(A) is a sectional view of a to process of forming a first GaN layer, FIG. 1(B) is a sectional view of a process of forming a Ta layer, FIG. 1(C) is a sectional view of a process of forming a second GaN layer and a void, FIG. 1(D) is a sectional view of the semiconductor substrate after forming the second GaN layer, FIG. 1(E) is a sectional view of the semiconductor substrate from which a sapphire substrate is separated, and FIG. 1(F) is a sectional view of a finished GaN substrate.

FIG. 5(A) and FIG. 5(B) are SEM micrographs of the semiconductor substrate according to the first example of the first exemplary embodiment, in which FIG. 5(A) is an SEM micrograph of a cross-section of the semiconductor substrate and FIG. 5(B) is an SEM micrograph of a surface of the semiconductor substrate.

FIG. 6(A) and FIG. 6(B) are EDX diagrams of the semiconductor substrate according to the first example of the first exemplary embodiment, in which FIG. 6(A) is an EDX diagram of Ga and FIG. 6(B) is an EDX diagram of Ta.

FIG. 7 (A) and FIG. 7(B) are SEM micrographs of a semiconductor substrate according to a first comparative example, in which FIG. 7(A) is an SEM perspective view of the semiconductor substrate and FIG. 7(B) is an SEM surface of the semiconductor substrate.

FIG. 8(A), FIG. 8(B), and FIG. 8(C) illustrate an EDX spectrum and EDX diagrams of the semiconductor substrate according to the first comparative example, in which FIG. 8(A) is an EDX spectrum of the semiconductor substrate of FIG. 7(B); FIG. 8(B) is an EDX diagram of Ga of FIG. 7(B); and FIG. 8(C) is an EDX diagram of N of FIG. 7(B).

FIG. 9(A) and FIG. 9(B) illustrate an SEM micrograph and an EDX spectrum of the semiconductor substrate according to the first comparative example, in which FIG. 9(A) is an SEM micrograph of a side section of a void and FIG. 9(B) is an EDX spectrum of the void of FIG. 9(A).

FIG. 10(A), FIG. 10(B), and FIG. 10(C) are EDX diagrams of the semiconductor substrate according to the first comparative example, in which FIG. 10(A) is an EDX diagram of Ga of FIG. 9(A); FIG. 10(B) is an EDX diagram of N of FIG. 9(A); and FIG. 10(C) is an EDX diagram of Ta of FIG. 9(A).

FIG. 18(A), FIG. 18(B), and FIG. 18(C) illustrate a flow diagram of a method of fabricating a light emitting device according to a fourth exemplary embodiment of the present invention, in which FIG. 18(A) is a sectional view of a process of forming a first GaN layer and a Ta layer; FIG. 18(B) is a sectional view of a process of forming a second GaN layer and a void; and FIG. 18(C) is a sectional view of a process of forming compound semiconductor layers on the second GaN layer.

DETAILED DESCRIPTION OF THE ILLUSTRATED EMBODIMENTS

Figure 1:
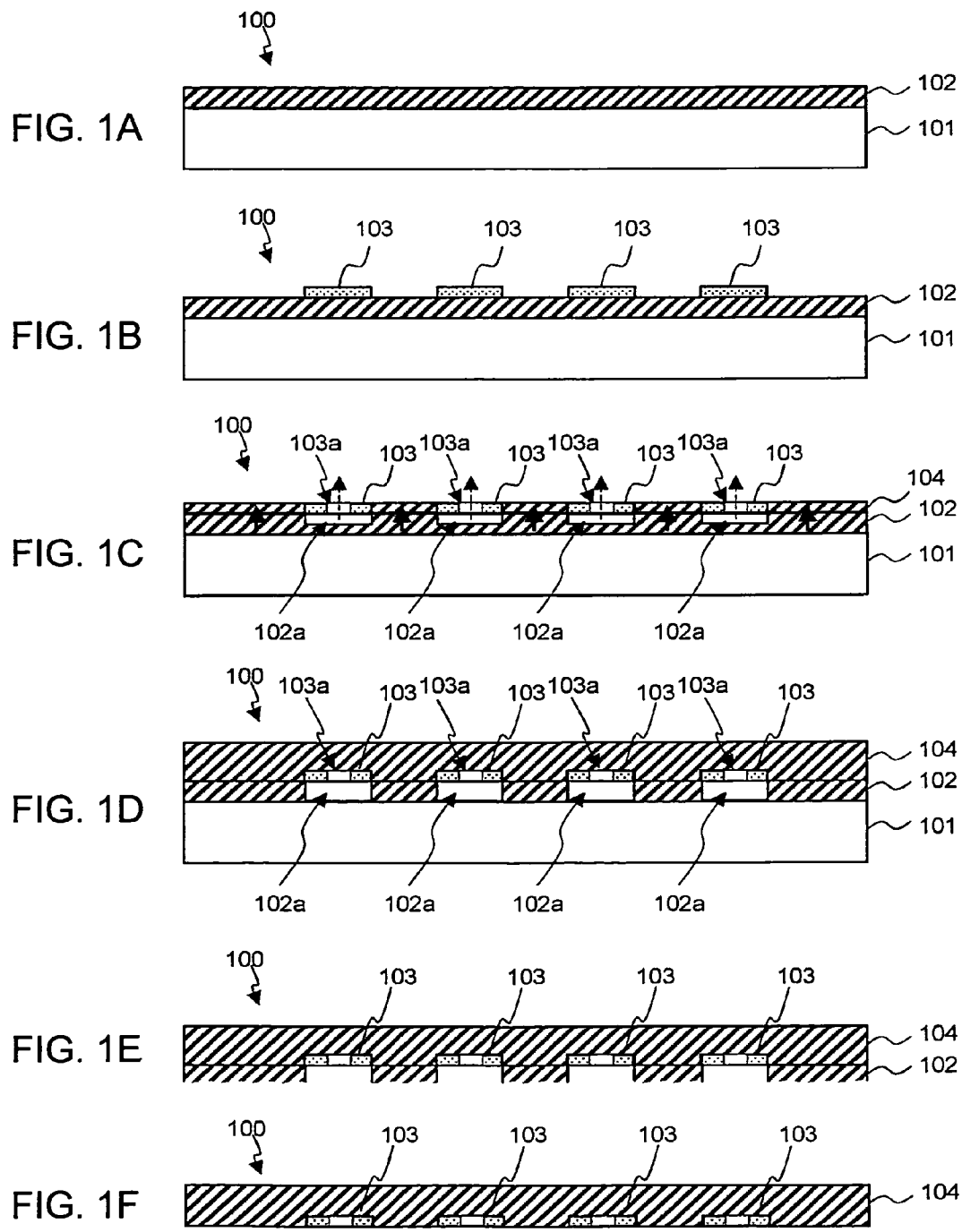

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIGS. 1(A)-1(F) illustrate a flow diagram of a method of manufacturing a semiconductor substrate 100 in accordance with a first exemplary embodiment of the present invention. FIG. 1 (A) is a sectional view of a process of forming a first GaN layer; FIG. 1(B) is a sectional view of a process of forming a Ta layer; FIG. 1(C) is a sectional view of a process of forming a second GaN layer and a void; FIG. 1(D) is a sectional view of the semiconductor substrate after forming the second GaN layer; FIG. 1(E) is a sectional view of the semiconductor substrate from which a sapphire substrate is separated; and FIG. 1(F) is a sectional view of a finished GaN substrate.

Referring to FIG. 1(A), reference numeral 101 indicates a sapphire ($Al_2O_3$) substrate. First, a first GaN layer 102 having a thickness of about 2 μm is formed on the sapphire substrate 101. This thickness of the first GaN layer 102 is provided as an example.

Next, referring to FIG. 1(B), a Ta layer (metallic material layer) 103 having a thickness of about 50 nm is formed in a shape of stripes, which have a width of 5 μm and are separated a distance of 5 μm from each other, on the first GaN layer 102 by electron beam (EB) deposition and lift-off. The shape, thickness, width, and separation distance of the Ta layer 103 are provided as an example.

Referring to FIG. 1(C), a second GaN layer 104 is formed on the first GaN layer 102 and the Ta layer 103 by metal organic chemical vapor deposition (MOCVD). The first GaN layer 102 and the second GaN layer 104 may each include different semiconductor material such as AlGaN, InGaN, or AlInGaN. FIG. 1(C) shows the second GaN layer 104 during formation thereof. In this embodiment, N in the first GaN layer 102 combines with Ta to form TaN, which is changed into a different substance and rises into a vapor phase region in which the concentration of N is relatively high. The TaN becomes unstable at 900° C. or more and is evaporated at 1000° C. or more. As the TaN is evaporated, a hole 103a is deepened to form a void 102a. Here, although N in the first GaN layer 102 becomes TaN, Ga remains in the first GaN layer 102. Since this Ga remaining in the first GaN layer 102 is the same as Ga deposited during the vapor deposition, it is used as the raw material. However, GaN may also be grown on a Ta film. As disclosed in Hasegawa, et al., there is a possibility that the surface of the Ta layer 103 becomes not only Ta, but also $Ta_2O_5$ in a reaction with air, as described below.

On the other hand, the thickness of the second GaN layer 104 may be greater than or equal to one half the thickness of the Ta layer 103. In addition, the second GaN layer 104 may have a thickness less than 1000 μm for use as a substrate.

As will be described below in more detail, Ta and N may react with each other to produce reaction by-products in the form of $Ta_xN_y$ during growth of the second GaN layer 104. Such by-products may deteriorate semiconductor substrate quality. Thus, it may be necessary to remove the reaction by-products by adjusting growth conditions. The reaction by-products may be removed by adjusting the growth conditions of the second GaN layer 104, for example, growth temperature, growth pressure, growth speed, flux of TMGa as a Ga source, and the like. Alternatively, the reaction by-products may be removed by evaporation by maintaining the substrate 101 at a temperature at which the reaction by-products are evaporated or by lowering a pressure around the substrate 101, after stopping the growth of the second GaN layer 104. Alternatively, the reaction by-products may be removed by maintaining the substrate 101 at a temperature at which the reaction by-products are evaporated or by lowering a pressure around the substrate 101, after completing the growth of the second GaN layer 104.

Next, referring to FIG. 1(D), once the formation of the second GaN layer 104 is completed, the semiconductor substrate 100 is formed. While the second GaN layer 104 is formed by MOCVD, a portion of the first GaN layer 102 under the Ta layer 103 is removed by etching and a formation region of the void 102a is extended substantially to the sapphire substrate 101, as shown in FIG. 1(D). Further, the surface of the substrate is flattened to progress the growth of the first GaN layer 102 along with the growth of the second GaN layer 104, as shown in FIG. 1. Consequently, it is possible to omit a process of flattening the surface of the substrate during formation of the semiconductor substrate 100 according to the first exemplary embodiment.

Next, referring to FIG. 1(E), the sapphire substrate 101 is separated from the first GaN layer 102. Then, referring to FIG. 1(F), a GaN substrate 100 may be obtained by polishing the first GaN layer 102, from which the sapphire substrate 101 is removed. The GaN substrate 100 may be used as a semiconductor substrate for manufacturing a device by attaching a silicon-based substrate such as Si or SiC to an upper side of the GaN substrate 100 and flattening a lower surface thereof.

Furthermore, although separation of the sapphire substrate 101 may be performed by a conventional laser lift-off or polishing process, the void 102a formed in the first GaN layer 102 may also be used to separate the sapphire substrate 101.

For example, the sapphire substrate 101 may be separated from the second GaN layer 104 by etching at least a portion of the first GaN layer 102 using a chemical solution. If the void 102a is not formed, it may be difficult for the chemical solution to infiltrate into an interface between the sapphire substrate 101 and the first GaN layer 102, making it difficult to separate the sapphire substrate 101 using the chemical solution. However, if the void 102a is formed in the first GaN layer 102, the chemical solution may infiltrate into the interface between the sapphire substrate 101 and the first GaN layer 102 through the void 102a, so that the sapphire substrate 101 can be more easily separated using the chemical solution.

Examples of the chemical solution may include KOH, NaOH, $H_2PO_4$, HCL, and $H_2SO_4$. The sapphire substrate 101 is separated from the second GaN layer 104 by etching the first GaN layer 102, which has the void 102a formed therein, using such a chemical etchant.

In addition to the chemical solution, light may be used to activate the chemical solution. That is, etching the first GaN layer 102 with the chemical solution may be conventional wet-type etching, photo-enhanced chemical etching or photo electrochemical etching.

Alternatively, separation of the sapphire substrate 101 may be achieved by twisting the sapphire substrate 101. Furthermore, separation of the sapphire substrate 101 may be achieved by heating the substrate 101 to grow the void 102a after completing the formation of the second GaN layer 104. As the void 102a gradually grows, a coupling force between the second GaN layer 104 and the sapphire substrate 101 is gradually weakened. As a result, the sapphire substrate 101 may be naturally separated from the second GaN layer 104. The sapphire substrate 101 may also be separated by applying force to the sapphire substrate 101 after the growth of the void 102.

The sapphire substrate 101 may be heated to 300° C. or more. For example, the sapphire substrate 101 may be heated in the range of 900~1100° C. Heating the sapphire substrate 101 may be performed while attaching a silicon-based substrate such as Si or SiC to the surface of the GaN substrate 100.

As such, when the semiconductor substrate 100 including the GaN layer is formed by MOCVD, the first GaN layer 102 can be easily separated from the sapphire substrate 101 using the void 102a, so that the separated GaN layer can be used as the GaN substrate. Accordingly, the GaN substrate may be manufactured at lower cost than the conventional GaN substrate.

Detailed examples of the manufacturing method of the semiconductor substrate 100 will be described hereinafter. In a first example of the first exemplary embodiment, the process of forming the second GaN layer 104 using an MOCVD apparatus will be described. In this example, crystal growth was performed at a heating temperature of 1045° C. for 5 hours while supplying tri-methyl gallium (TMGa) as a raw gas at a flux of 20 μmol/min. Further, in the first example, a Ta layer 103 having a thickness of 50 nm was formed in a shape of stripes on the first GaN layer 102.

Figure 2:
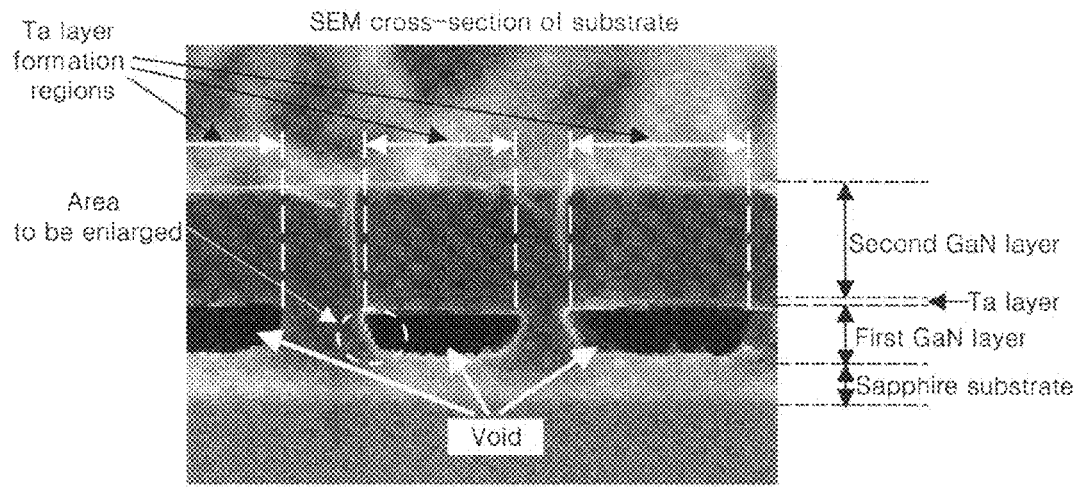
FIG. 2 is a scanning electron microscope (SEM) cross-section of a semiconductor substrate according to a first example of the first exemplary embodiment.

In FIG. 2, the semiconductor substrate 100 with the second GaN layer 104 formed thereon under these conditions is shown. FIG. 2 is a SEM micrograph of a side section of a portion of the semiconductor substrate 100. As shown in FIG. 2, the void 102a is formed in a portion of the first GaN layer 102 under the Ta layer 103. An enlarged region including the void 102a in FIG. 2 was analyzed using an energy dispersion x-ray spectrometer (EDX), and the analysis result is shown in FIG. 3.

Figure 3:
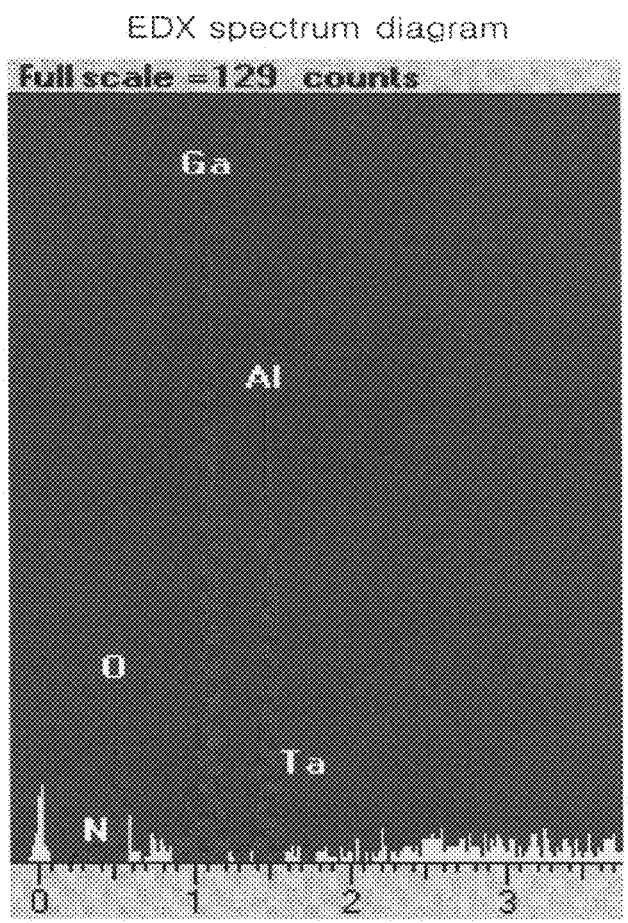
FIG. 3 is an energy dispersive x-ray spectrometer (EDX) spectrum diagram of the semiconductor substrate according to the first example of the first exemplary embodiment.
Figure 4A:
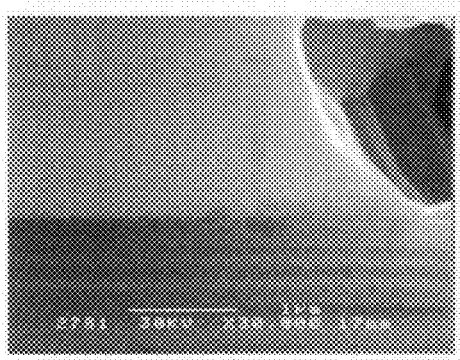
FIG. 4(A) is an SEM cross-section of an enlarged area shown in FIG. 2 according to the first example of the first exemplary embodiment.
Figure 4B:
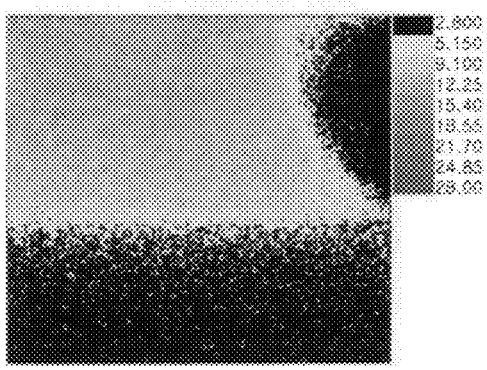
FIG. 4(B) is a Ga EDX diagram of the semiconductor substrate according to the first example of the first exemplary embodiment.
Figure 4C:
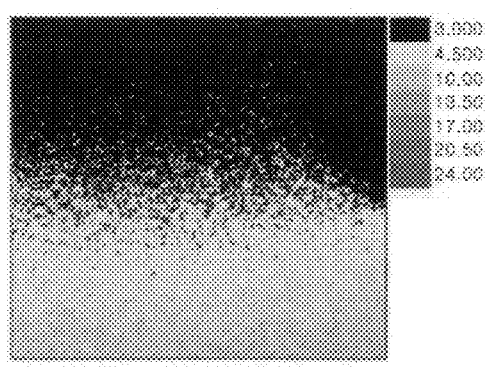
FIG. 4(C) is an Al EDX diagram of the semiconductor substrate according to the first example of the first exemplary embodiment.
Figure 4D:
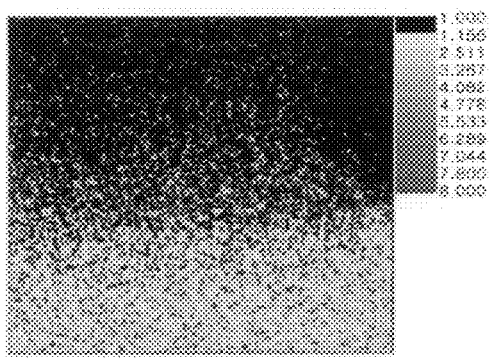
FIG. 4(D) is an O EDX diagram of the semiconductor substrate according to the first example of the first exemplary embodiment.

In the EDX spectrum of FIG. 3, GaN of the first GaN layer 102, and Al and O of the sapphire substrate 101 are observed, but Ta is substantially not observed. Further, in EDX diagrams of FIG. 4(B), FIG. 4(C), and FIG. 4(D), Ga of the first GaN layer 102, and Al and O of the sapphire substrate 101 are observed, but Ta is not substantially observed.

In the first example, it was observed that holes 103a were formed in the Ta layer 103 during the formation of the second GaN layer 104. Analysis results of the holes 103a formed in the Ta layer 103 are shown in FIGS. 5(A)-5(B) and FIGS. 6(A)-6(B), and will be described in detail hereinafter. Here, the analysis results shown in FIGS. 5(A)-5(B) and FIGS. 6(A)-6(B) were obtained using the EDX by stopping the process of forming the second GaN layer 104 using the MOCVD apparatus.

Figure 5A:
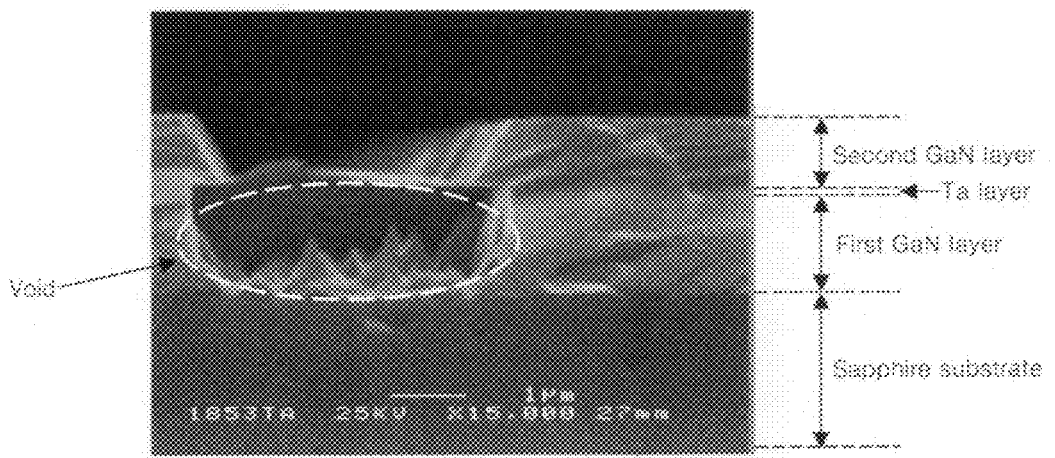
Figure 5B:
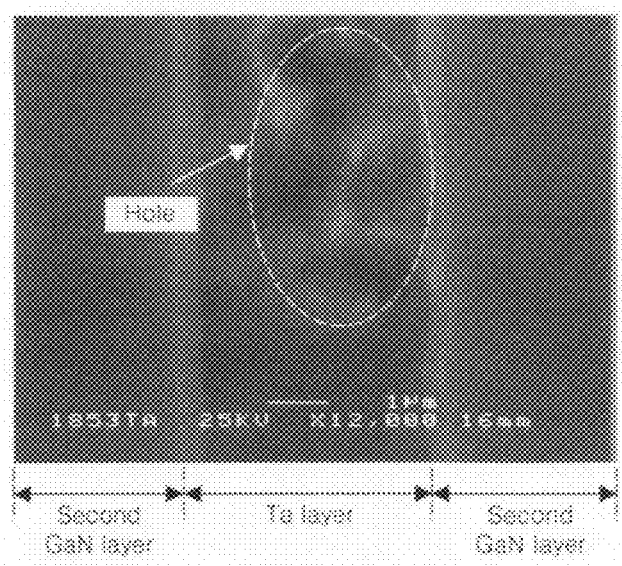
Figure 6A:
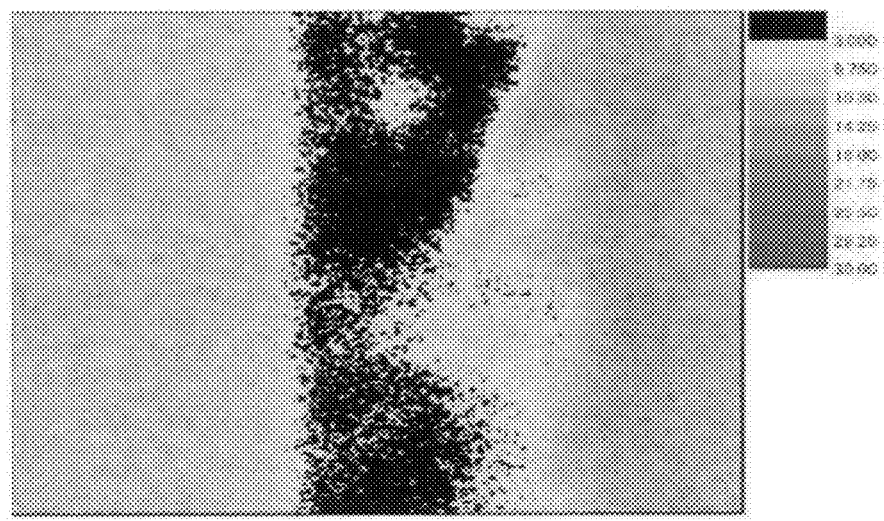
Figure 6B:
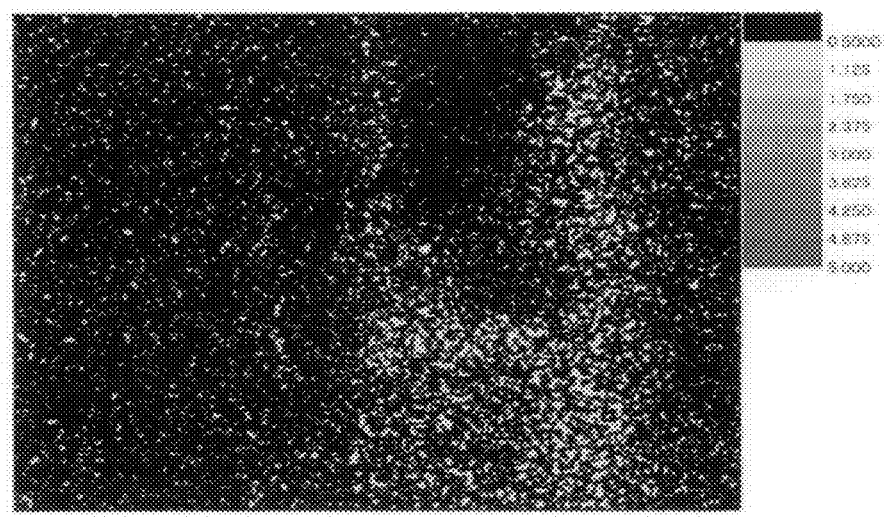

FIGS. 5(A)-5(B) show SEM micrographs of the semiconductor substrate of the first example, in which FIG. 5(A) is a SEM micrograph of a side section of the semiconductor substrate 100 and FIG. 5(B) is a SEM micrograph of a surface of the semiconductor substrate 100. FIGS. 6(A)-6(B) show EDX diagrams of the surface of the semiconductor substrate 100 of FIG. 5(B), in which FIG. 6(A) is an EDX diagram of Ga and FIG. 6(B) is an EDX diagram of Ta.

In the SEM micrograph of the semiconductor substrate 100 of FIG. 5(A), it is observed that a portion of the first GaN layer 102 under the Ta layer 103 is etched and the void 102a is formed therein. In the SEM micrograph of the semiconductor substrate 100 of FIG. 5(B), it is observed that holes 103a were formed on a surface of the Ta layer 103. EDX analysis results for Ga and Ta on the surface of the Ta layer 103 including the holes 103a are shown in FIG. 6(A) and FIG. 6(B). As shown in the EDX diagrams, the Ta layer 103 remains, and Ga and GaN are thinly grown on the remaining Ta layer 103.

As such, for the semiconductor substrate 100 of the first example, the conditions for forming the second GaN layer 104 using the MOCVD apparatus were adjusted to permit the void 102a to be formed in the first GaN layer 102 using the Ta layer by etching. Thus, when the second GaN layer 104 was formed as illustrated in the first exemplary embodiment, it was possible to form the void 102a in the first GaN layer 102 by etching during growth of the first GaN layer 102. That is, when a metallic material layer was partially formed on the first GaN layer 102, it was possible to form the void 102a in the first GaN layer 102.

In addition, the MOCVD conditions for the first example are provided as an example, and thus, may be set to allow the growth of the first GaN layer and the formation of the void 102a to be simultaneously progressed. Here, since the growth rate of the first GaN layer 102 was slower than that of the second GaN layer 104, the MOCVD conditions were adjusted in consideration of the growth rate of the first GaN layer 102 in the first example.

Further, in the first example, the holes 103a were formed in the Ta layer 103 during the process of growing the second GaN layer 104, but, for example, the Ta layer 103 may be formed using a mask which is previously formed with holes. Further, the shape of the Ta layer 103 is not limited to the aforementioned stripe shape, and may be changed depending on a device structure to be formed on the semiconductor substrate 100. An example of a device formed using the semiconductor substrate 100 will be described below.

Further, the semiconductor substrate 100 of the first exemplary embodiment may be reused as a substrate 101 forming a GaN layer having the aforementioned void by separating the GaN substrate and then a surface of the sapphire substrate 101 on which a new GaN substrate is formed may be flattened by reactive ion etching (RIE) or the like. Hence, manufacturing costs of the GaN substrate can be further reduced.

Further, although the sapphire substrate is used as a growth substrate in the first exemplary embodiment, any suitable substrate, for example, a silicon-based substrate, may be used so long as it allows growth of the GaN layer thereon.

In a second example of the first exemplary embodiment, the process of forming the second GaN layer 104 using an MOCVD apparatus will be described. In this example, crystal growth was performed at a heating temperature of 1045° C. for 5 hours while supplying TMGa as a raw gas at a flux of 20 μmol/min. Further, in the second example, a Ta layer 103 having a thickness of 30 nm was formed in a shape of stripes on the first GaN layer 102.

Figure 12:
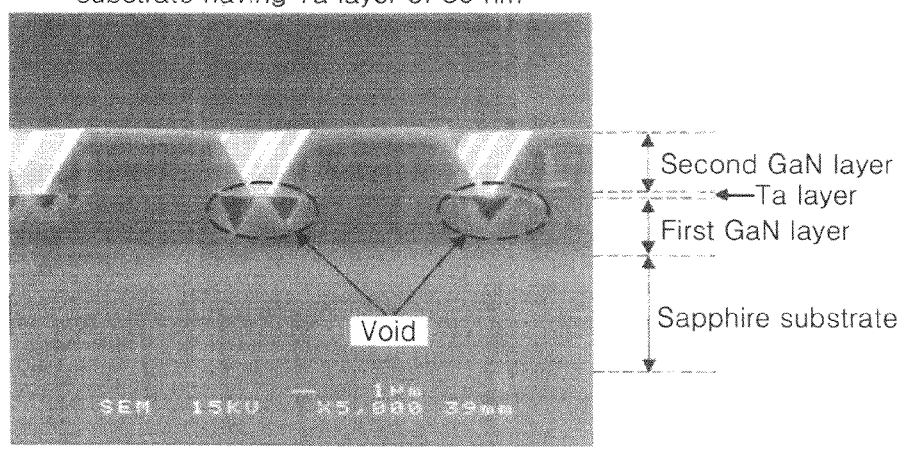
FIG. 12 is an SEM micrograph of a side section of a semiconductor substrate according to a second example of the first exemplary embodiment.

In FIG. 12, the semiconductor substrate 100 with the second GaN layer 104 formed thereon under these conditions is shown. FIG. 12 is a SEM micrograph of a cross-section of a portion of the semiconductor substrate 100. As shown in FIG. 12, a void 102a is formed in a portion of the first GaN layer 102 under the Ta layer 103. Further, in the second example, it was observed that holes 103a were formed in the Ta layer 103 during the formation of the second GaN layer 104.

For the semiconductor substrate 100 of the second example, the conditions for forming the second GaN layer 104 using the MOCVD apparatus were adjusted to permit the void 102a to be formed in the first GaN layer 102 using the Ta layer 103 by etching. Thus, when the second GaN layer 104 is formed as illustrated in the second example, it is possible to form the void 102a in the first GaN layer 102 by etching during growth of the first GaN layer 102. In other words, when a metallic material layer was partially formed on the first GaN layer 102, it was possible to form the void 102a in the first GaN layer 102. The metallic material layer may be used for etching the first GaN layer 102 as discussed above in relation to the first exemplary embodiment.

In the sectional view of FIG. 12, the voids 102a caused by etching are not formed in the first GaN layer 102 under the overall lower surface of each of the Ta layers 103, but under opposite ends of each of the Ta layers 103. FIG. 12 shows that etching is performed in the first GaN layer 102 from the opposite ends of each of the Ta layers 103.

Further, the MOCVD conditions for the second example are provided as an example, and thus, may be set to allow the growth of the first GaN layer and the formation of the void 102a to be simultaneously progressed. Here, since the growth rate of the first GaN layer 102 is slower than that of the second GaN layer 104, the MOCVD conditions were adjusted in consideration of the growth rate of the first GaN layer 102 in the second example.

Further, in the second example, the holes 103a were formed in the Ta layer 103 during the process of growing the second GaN layer 104, but, for example, the Ta layer 103 may be formed using a mask which is previously formed with holes. Further, the shape of the Ta layer 103 is not limited to the aforementioned stripe shape, and may be changed depending on a device structure to be formed on the semiconductor substrate 100. An example of a device formed using the semiconductor substrate 100 will be described below.

Further, the semiconductor substrate 100 of the second example may be reused as a substrate 101 for forming a GaN layer having the aforementioned void. The GaN substrate may be separated and then a surface of the sapphire substrate 101 on which a new GaN substrate is formed may be flattened by RIE or the like. Hence, manufacturing costs of the GaN substrate can be further reduced.

In a third example of the first exemplary embodiment, the process of forming the second GaN layer 104 using an MOCVD apparatus will be described. In this example, crystal growth was performed at a heating temperature of 1045° C. for 5 hours while supplying TMGa as a raw gas at a flux of 20 μmol/min. Further, in the third example, a Ta layer 103 having a thickness of 50 nm was formed in a shape of stripes on the first GaN layer 102.

Figure 13:
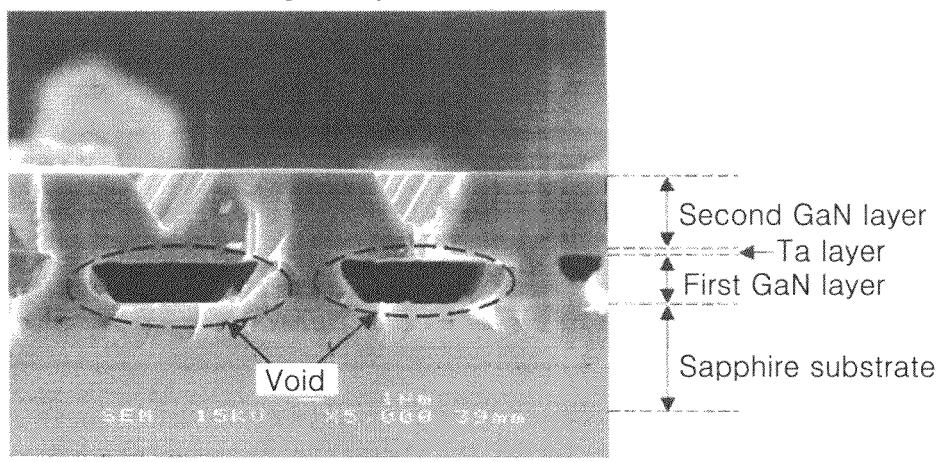
FIG. 13 is an SEM micrograph of a side section of a semiconductor substrate of according to a third example of the first exemplary embodiment.

In FIG. 13, the semiconductor substrate 100 with the second GaN layer 104 formed thereon under these conditions is shown. FIG. 13 is an SEM micrograph of a side section of a portion of the semiconductor substrate 100. As shown in this Fig., a void 102a is formed in a portion of the first GaN layer 102 under the Ta layer 103. Further, in the third example, it was observed that holes 103a were formed in the Ta layer 103 during the formation of the second GaN layer 104.

For the semiconductor substrate 100 of the third example, the conditions for forming the second GaN layer 104 using the MOCVD apparatus were adjusted to permit the void 102a to be formed in the first GaN layer 102 under the Ta layer 103 by etching. Thus, when the second GaN layer 104 was formed as illustrated in the first exemplary embodiment, it was possible to form the void 102a in the first GaN layer 102 by etching during growth of the first GaN layer 102. In other words, when a metallic material layer was partially formed on the first GaN layer 102, it was possible to form the void 102a in the first GaN layer 102. The metallic material layer may be used for etching the first GaN layer 102 as discussed above in relation to the first exemplary embodiment.

In addition, the MOCVD conditions for the third example are provided as an example, and thus, may be set to allow the growth of the first GaN layer 102 and the formation of the void 102a to be simultaneously progressed. Here, since the growth rate of the first GaN layer 102 is slower than that of the second GaN layer 104, the MOCVD conditions were adjusted in consideration of the growth rate of the first GaN layer 102 in the third example.

Further, in the third example, the holes 103a were formed in the Ta layer 103 during the process of growing the second GaN layer 104, but the Ta layer 103 may be formed using a mask which is previously formed with holes. Further, the shape of the Ta layer 103 is not limited to the aforementioned stripe shape, and may be changed depending on a device structure to be formed on the semiconductor substrate 100. An example of a device formed using the semiconductor substrate 100 will be described below.

In a fourth example of the first exemplary embodiment, the process of forming the second GaN layer 104 using an MOCVD apparatus will be described. In this example, crystal growth was performed at a heating temperature of 1045° C. for 5 hours while supplying TMGa as a raw gas at a flux of 20 µmol/min. Further, in the fourth example, a Ta layer 103 having a thickness of 100 nm was formed in a shape of stripes on the first GaN layer 102.

Figure 14:
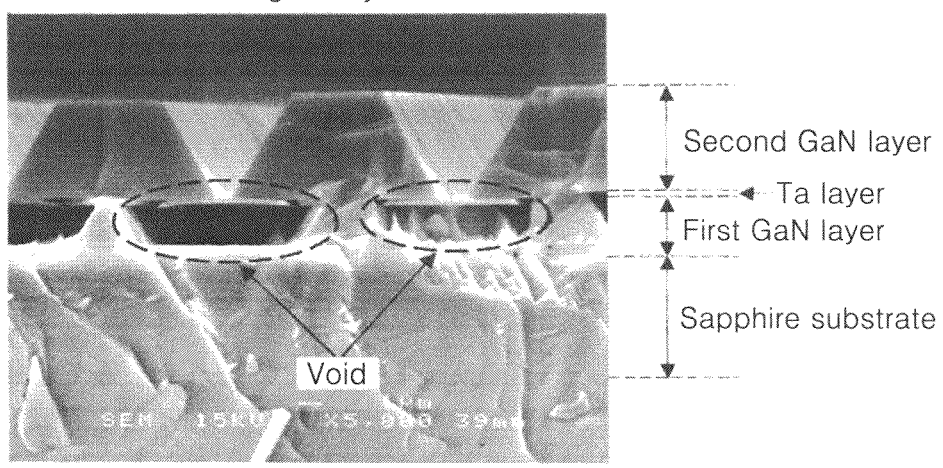
FIG. 14 is an SEM micrograph of a side section of a semiconductor substrate of according to a fourth example of the first exemplary embodiment.

In FIG. 14, the semiconductor substrate 100 with the second GaN layer 104 formed thereon under these conditions is shown. FIG. 14 is a SEM micrograph of a side section of a portion of the semiconductor substrate 100. As shown in FIG. 14, a void 102a is formed in a portion of the first GaN layer 102 under the Ta layer 103. Further, in the fourth example, it was observed that holes 103a were formed in the Ta layer 103 during the formation of the second GaN layer 104.

For the semiconductor substrate 100 of the fourth example, the conditions for forming the second GaN layer 104 using the MOCVD apparatus were adjusted to permit the void 102a to be formed in the first GaN layer 102 using the Ta layer 103 by etching. Thus, when the second GaN layer 104 was formed as illustrated in the first exemplary embodiment, it was possible to form the void 102a in the first GaN layer 102 by etching during growth of the first GaN layer 102. In other words, when a metallic material layer was partially formed on the first GaN layer 102, it was possible to form the void 102a in the first GaN layer 102. The metallic material layer may be used for etching the first GaN layer 102 as discussed above in relation to the first exemplary embodiment.

In addition, the MOCVD conditions for the fourth example are provided as an example, and thus, may be set to allow the growth of the first GaN layer and the formation of the void 102a to be simultaneously progressed. Here, since the growth rate of the first GaN layer 102 is slower than that of the second GaN layer 104, the MOCVD conditions were adjusted in consideration of the growth rate of the first GaN layer 102 in the fourth example.

Further, in the fourth example, the holes 103a were formed in the Ta layer 103 during the process of growing the second GaN layer 104, but, for example, the Ta layer 103 may be formed using a mask which is previously formed with holes. Further, the shape of the Ta layer 103 is not limited to the aforementioned stripe shape, and may be changed depending on a device structure to be formed on the semiconductor substrate 100. An example of a device formed using the semiconductor substrate 100 will be described below.

A first comparative example will be described hereinafter. In the first comparative example, the process of forming the second GaN layer 104 of the semiconductor substrate 100 under different conditions of the MOCVD apparatus will be described.

In the first comparative example, crystal growth was performed at a heating temperature of 1045° C. for 5 hours while supplying TMGa as a raw gas at a flux of 87 µmol/min.

Figure 7A:
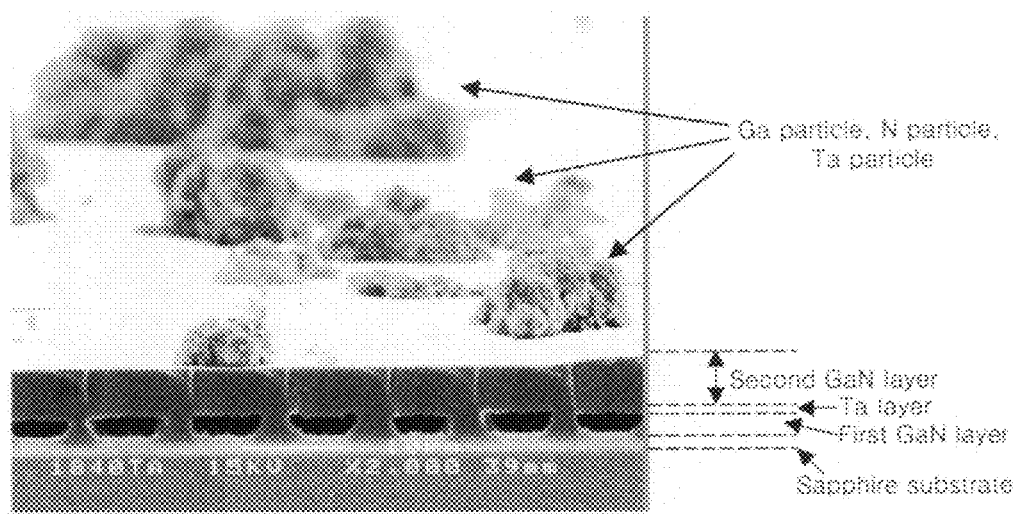
Figure 7B:
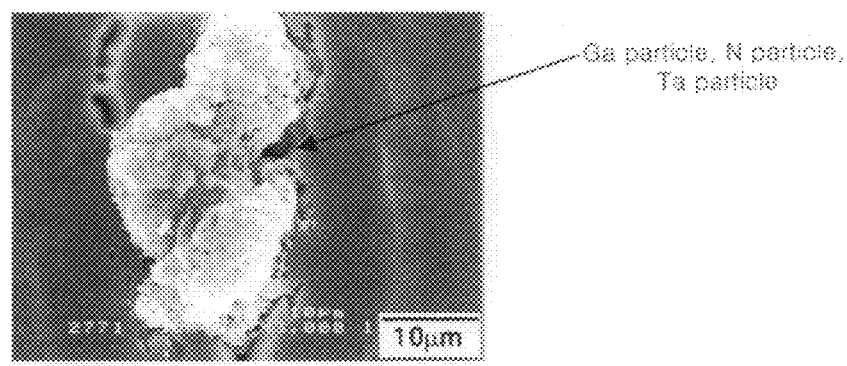

In FIGS. 7(A)-7(B), the semiconductor substrate 100 with the second GaN layer 104 formed thereon under these conditions is shown. FIG. 7(A) is an SEM micrograph of a side section of a portion of the semiconductor substrate 100 and FIG. 7(B) is an SEM micrograph of a surface of the semiconductor substrate shown in FIG. 7(A). As clearly shown in these micrographs, granular materials are precipitated on the surface of the second GaN layer 104 and a void 102a is formed in a portion of the first GaN layer 102 under the Ta layer 103. The following EDX analysis shows that the granular materials are Ga granules, N granules, and Ta granules.

Figure 8A:
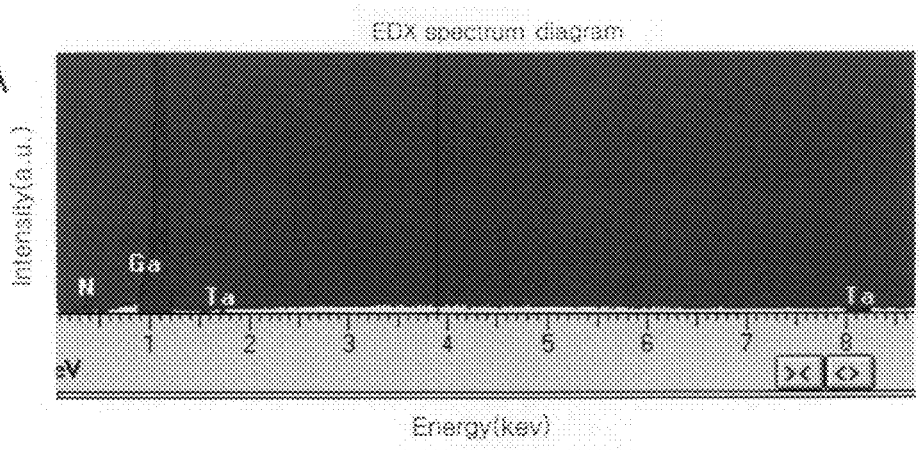
Figure 8B:
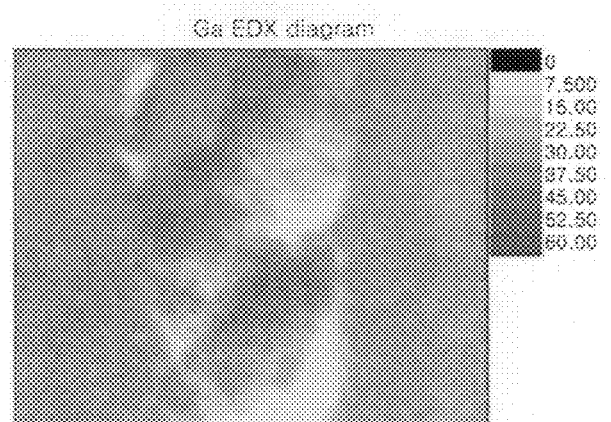
Figure 8C:
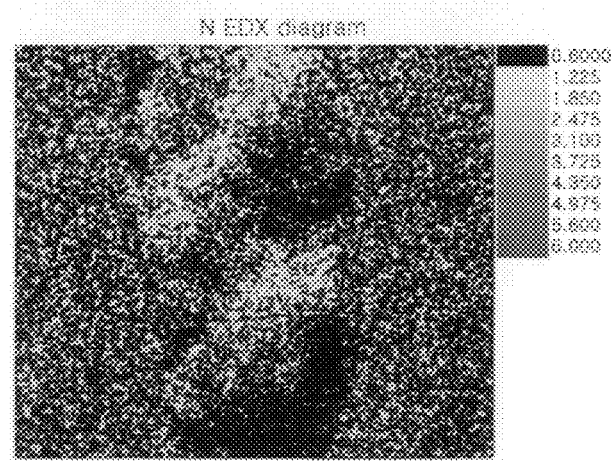

FIGS. 8(A)-8(C) show results of EDX analysis on the surface of the granular materials. FIG. 8(A) is an EDX spectrum of the granular materials shown in FIG. 7(B); FIG. 8(B) is an EDX diagram of Ga obtained by EDX analysis of the granular materials of FIG. 7(B); and FIG. 8(C) is an EDX diagram of N obtained by EDX analysis of the granular materials of FIG. 7(B). In the EDX spectrum of FIG. 8(A), Ga, N and a trace of Ta are observed, so that Ga and N are observed as shown in the EDX diagrams of FIG. 8(B) and FIG. 8(C).

Figure 9A:
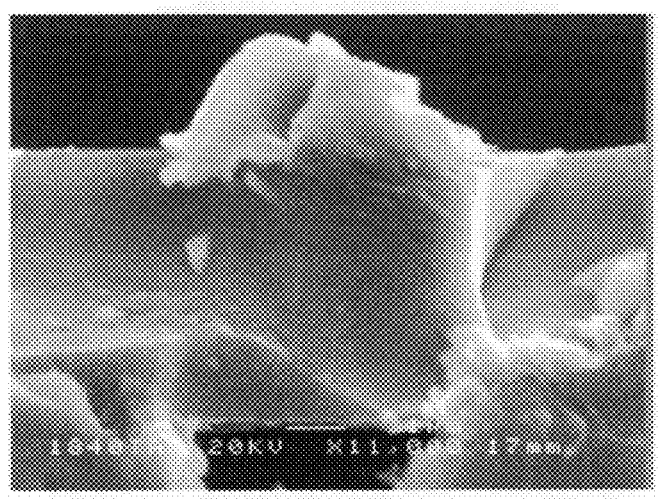
Figure 9B:
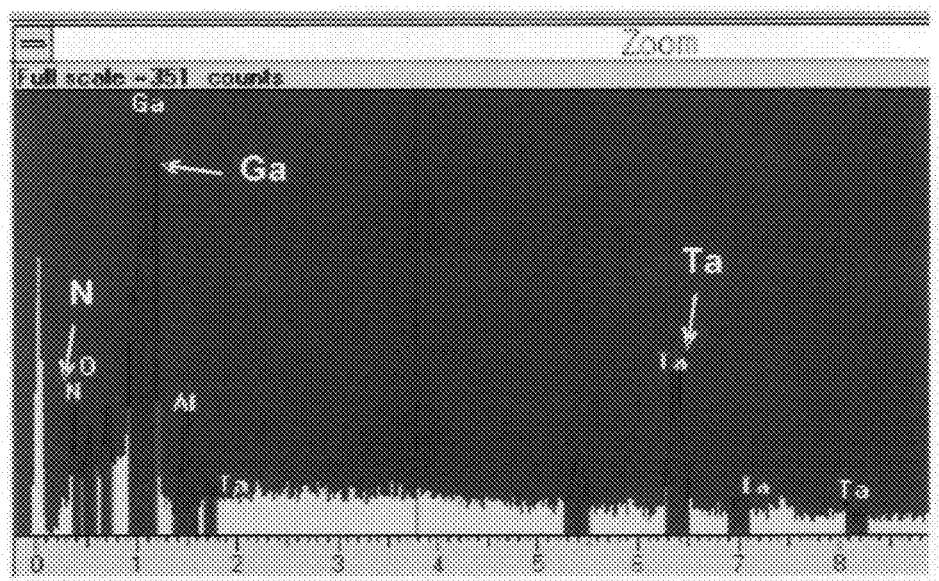
Figure 10A:
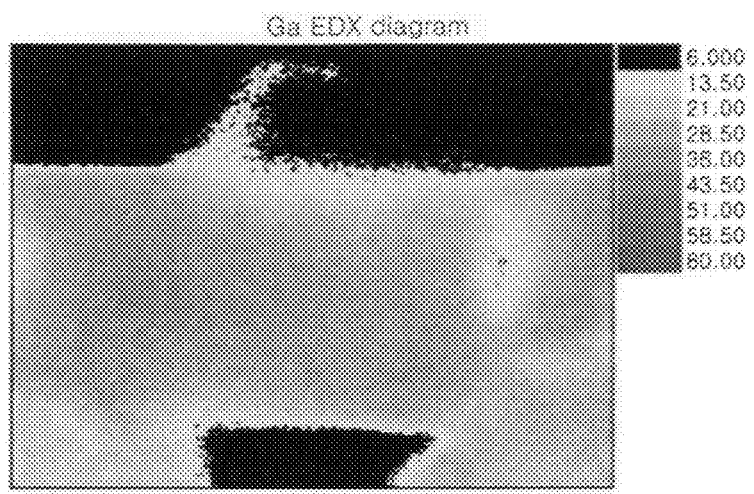
Figure 10B:
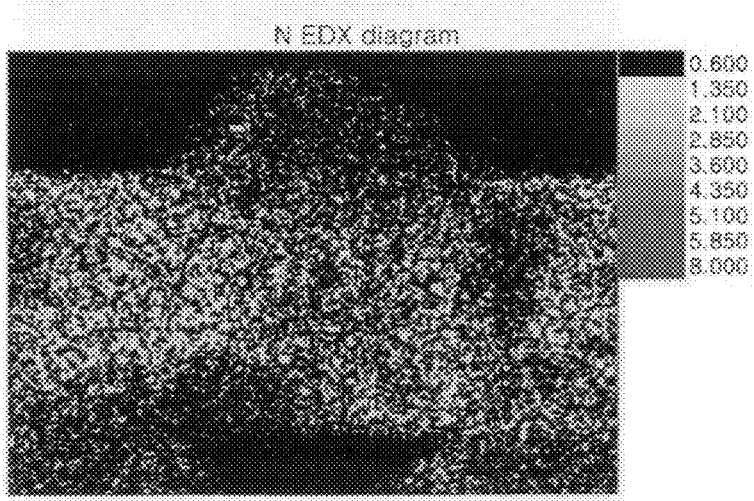
Figure 10C:
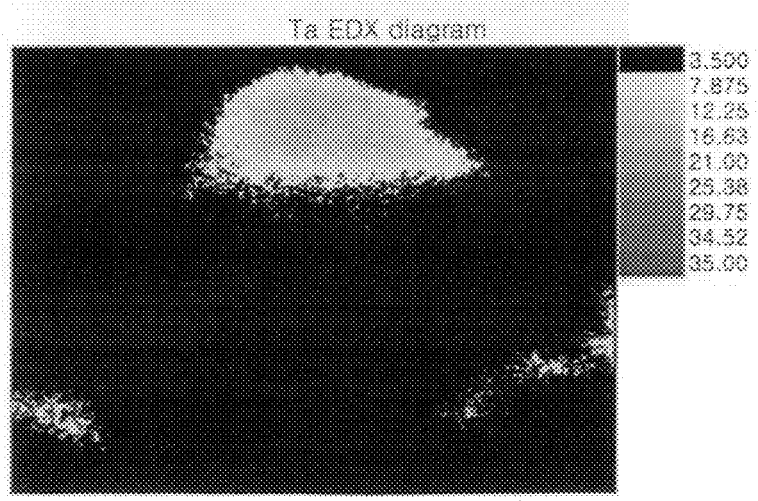

Results of EDX analysis on cross sections of the granular materials are shown in FIGS. 9(A)-9(C) and FIGS. 10(A)-10(C). FIG. 9(A) is an SEM micrograph of a side section of a void formed as a granular material shown in FIG. 7(B) and FIG. 9(B) is an EDX spectrum of the void shown in FIG. 9(A). FIG. 10(A) is an EDX diagram of Ga obtained by EDX analysis on the side section of the void of FIG. 9(A); FIG. 10(B) is an EDX diagram of N obtained by EDX analysis on the side section of the void of FIG. 9(A); and FIG. 10(C) is an EDX diagram of Ta obtained by EDX analysis on the side section of the void of FIG. 9(A).

In the spectrum of FIG. 9(B), Ga and N of the second GaN layer 104 and the granular materials, Ta of the Ta layer 103, and Al and O of the sapphire substrate 101 are observed. Further, as shown in FIGS. 10(A), 10(B), and 10(C), Ga, N and Ta are respectively observed at the void.

From these results, it is ascertained that the granular materials precipitated on the surface of the second GaN layer 104 are Ga granules, N granules, and Ta granules. Namely, in the first comparative example, it is believed that a bond between Ga and N at an etched portion of the first GaN layer 103 is broken, a reaction of GaO is caused, and gasification of Ga and N is blocked, thereby causing precipitation of the Ga granules, N granules and Ta granules on the surface of the second GaN layer.

As such, in the conditions of the MOCVD apparatus for the first comparative example, the flux of TMGa was set to 87 µmol/min, which is higher than that of the first example, thereby causing the precipitation of such granular materials on the substrate. Thus, a desired flux X of the TMGa not causing precipitation of the granular materials on the substrate is less than 87 µmol/min.

The granular materials of the first comparative example contain Ta and N, which can be removed by evaporation when the substrate 101 is maintained at a relatively high temperature or when a pressure around the substrate 101 is lowered. Further, the granular materials may be evaporated during growth of the second GaN layer by maintaining the substrate 101 at a temperature at which Ta and N of the granular materials are evaporated, or by maintaining the substrate 101 at a pressure at which these granular materials are evaporated, after stopping the growth of the second GaN layer.

In the second, third, and fourth examples of the first exemplary embodiment, the thickness of the Ta layer 103 was changed to 30 nm, 50 nm, and 100 nm, respectively. The void 102a was formed in the first GaN layer 104 by etching even when the thickness of the Ta layer 103 was changed in this manner.

Figure 15A:
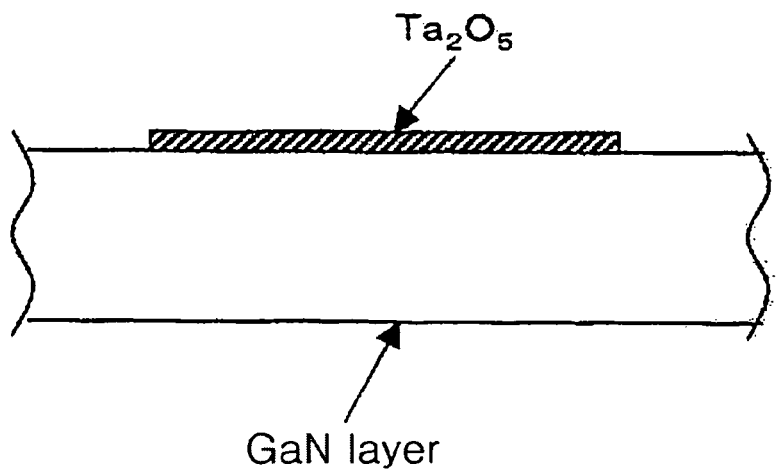
FIG. 15(A) is a diagram showing an exemplary embodiment of a $Ta_2O_5$ film converted from a 5 nm thick Ta layer.
Figure 15B:
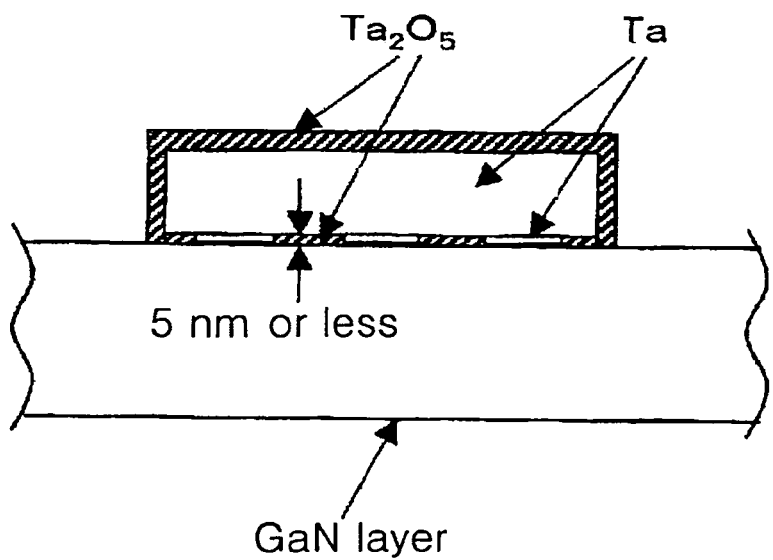
FIG. 15(B) is a diagram showing an exemplary embodiment of a $Ta_2O_5$ film formed on a surface of a 100 nm thick Ta layer.
Figure 16A:
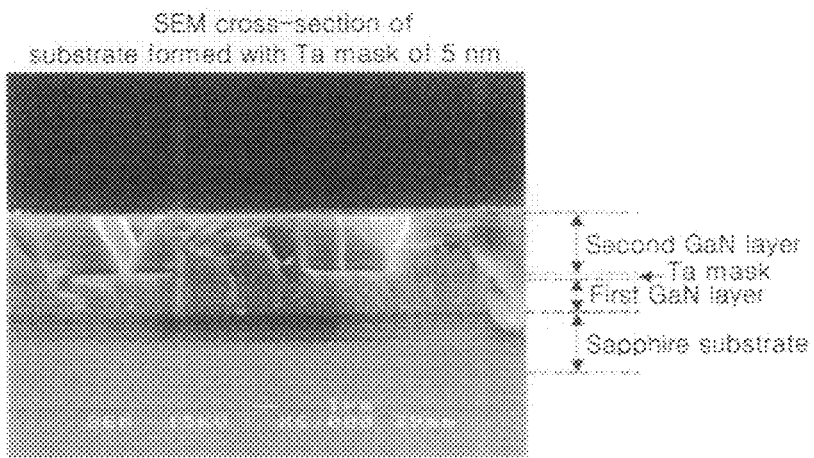
FIG. 16(A) is an SEM micrograph of a surface of a substrate having a 5 nm thick Ta mask.
Figure 16B:
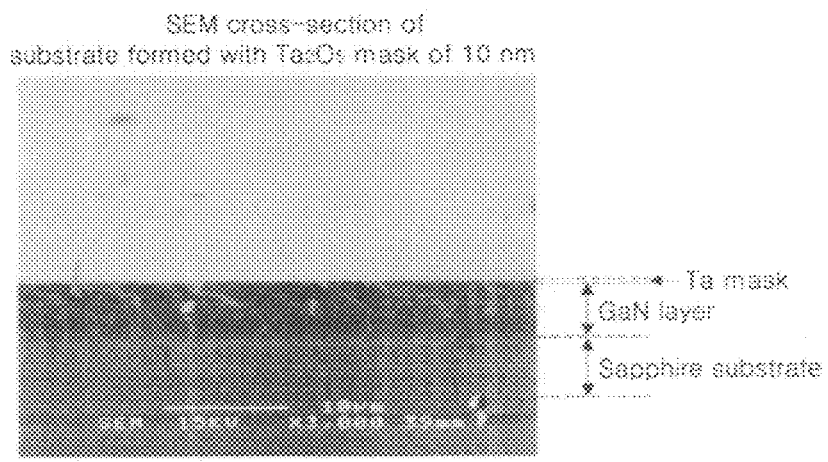
FIG. 16(B) is an SEM micrograph of a surface of a substrate having a 10 nm thick $Ta_2O_5$ mask.

FIGS. 15(A) and 15(B) diagrammatically show that a $Ta_2O_5$ region formed in the Ta layer 103 varies depending on the thickness of the Ta layer 103. FIG. 15(A) is a diagram showing a $Ta_2O_5$ film converted from a 5 nm thick Ta layer 103, and FIG. 15(B) is a diagram showing a $Ta_2O_5$ film converted from a surface of a 100 nm thick Ta layer. After depositing the Ta layer 103 on the surface of the first GaN layer 102 using an electron beam (EB) deposition apparatus, the Ta layer 103 was transferred to an MOCVD apparatus while being exposed to air. During the transfer of the Ta layer 103, the Ta layer 103 was converted into $Ta_2O_5$ by reaction with oxygen. As a result, when the Ta layer 103 was deposited to a thickness of 5 nm as shown in FIG. 15(A), the overall Ta layer 103 was converted into $Ta_2O_5$, and when the 100 nm thick Ta layer 103 was deposited as shown in FIG. 15(B), the surface of the Ta layer 103 was converted into $Ta_2O_5$. In other words, when Ta contacts air at room temperature, $Ta_2O_5$ is formed. FIG. 15(A) diagrammatically shows an example of lateral growth of a 5 nm thick Ta layer on a GaN layer. Further, FIG. 16 shows an example of lateral growth of a 10 nm thick $Ta_2O_5$ film on a substrate. In both examples, the growth was progressed without etching of the GaN layer under the Ta layer. In other words, when a substrate having a 5 nm thick Ta layer thereon was transferred to the MOCVD apparatus while being exposed to air, a 5 nm thick $Ta_2O_5$ film was formed on the substrate in FIG. 15(A). The $Ta_2O_5$ film was a very good mask which was laterally grown. On the other hand, when the 100 nm thick Ta layer was deposited as shown in FIG. 15(B), the result was different. When the Ta layer is deposited by EB deposition, a raw material of Ta is positioned in air and a thin oxide layer is thus formed on the Ta layer. As Ta is further deposited, it is converted initially into $Ta_2O_5$, but conversion into $Ta_2O_5$ gradually slows to allow deposition of Ta. The $Ta_2O_5$ film has a thickness of 5 nm or less on the GaN layer and contains a portion composed of Ta. An upper layer of the $Ta_2O_5$ film is composed of Ta. Further, as the substrate having the Ta layer thereon is transferred to the MOCVD apparatus while being exposed to air, a thin $Ta_2O_5$ film is formed on the Ta layer. As a result, the surface of the Ta layer is enveloped in the thin $Ta_2O_5$ film. In this Ta layer, the $Ta_2O_5$ film on the GaN layer is partially mixed with Ta. This result is diagrammatically shown in FIG. 15(B). Although N of the GaN layer and Ta of the Ta layer are coupled to form TaN, Ga is still used as the raw material, since Ga is the same as Ga deposited during vapor deposition.

In the first, second, third, and fourth examples, a $Ta_2O_5$ region formed by oxidation of the Ta layer 103 was laterally grown with respect to the first GaN layer 102 and serves as an etching mask. As a result, in the second example, as shown in FIG. 12, it was ascertained that the $Ta_2O_5$ region was not formed at the opposite ends of the 30 nm thick Ta layer 103, and the formation of the void 102a was progressed from portions of the first GaN layer 102 under the opposite ends of the Ta layer 103. In both the third and fourth examples, in which the Ta layers 103 were formed to a thickness of 50 nm and a thickness of 100 nm, respectively, the formation of the void 102a was progressed as in the second example, since the $Ta_2O_5$ region was formed on the surface of the Ta layer to act as the etching mask with respect to the first GaN layer 102.

Accordingly, as in the first, second, third, and fourth examples, a thickness of the Ta layer 103 may be in the range of 20~100 nm in order to permit formation of the $Ta_2O_5$ region, which acts as the etching mask. Further, in FIG. 16(A), which shows an example of a 5 nm thick Ta mask formed on the first GaN layer 102, the void 102a is not formed under the Ta mask. Further, in FIG. 16(B), which shows an example of forming only the $Ta_2O_5$ mask, it is ascertained that the $Ta_2O_5$ mask can be formed on the GaN layer and InGaAlN layer, for example. Thus, since the $Ta_2O_5$ mask is formed regardless of the thickness of the Ta layer 103, it is possible to progress the formation of the void 102a in the first GaN layer 102 under the $Ta_2O_5$ mask.

Next, in a second exemplary embodiment of the present invention, a light emitting diode (LED) array formed on the semiconductor substrate 100 of the first exemplary embodiment will be described with reference to FIG. 11.

Figure 11:
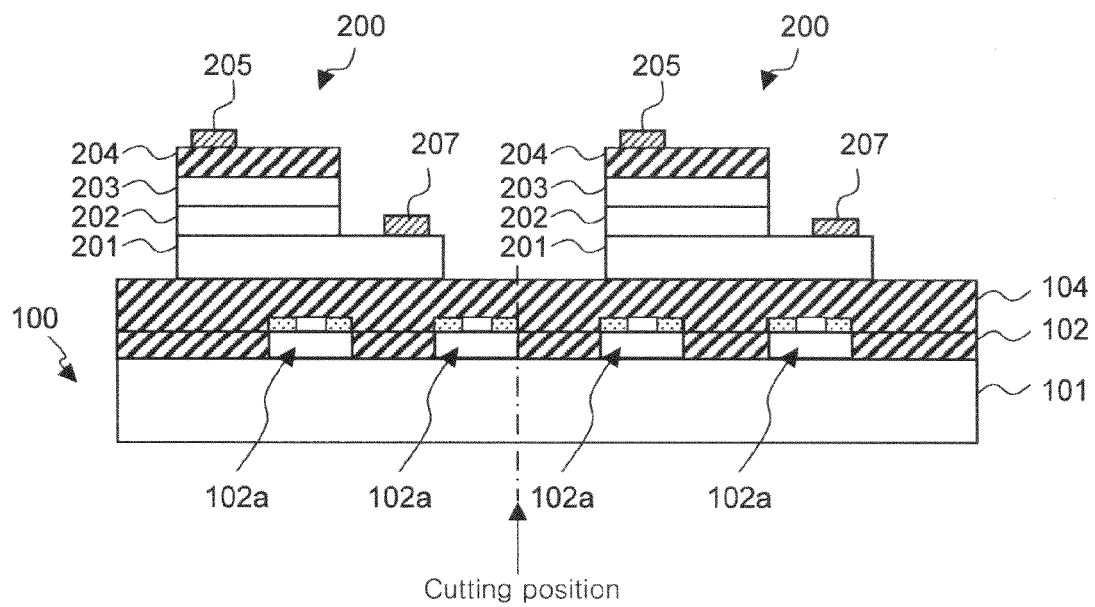
FIG. 11 is a sectional view of an LED array according to a second exemplary embodiment of the present invention.

FIG. 11 is a sectional view of an LED array according to the second exemplary embodiment.

Referring to FIG. 11, LEDs 200 are separated from each other on the semiconductor substrate 100. Each LED 200 includes a lower semiconductor layer 201 composed of a first compound semiconductor layer, an active layer 202, and an upper semiconductor layer 203 composed of a second compound semiconductor layer. The upper and lower semiconductor layers 203, 201 may comprise the same class as the first and second GaN layers 102, 104. The active layer 202 may have a single or multi-quantum well structure having a barrier layer, and may be formed of a material and composition selected depending on a desired light emitting frequency. For example, the active layer 202 may be formed of a gallium nitride-based compound semiconductor. The upper and lower semiconductor layers 201, 203 may be gallium nitride-based compound semiconductors having a greater band gap than that of the active layer 202.

In the present exemplary embodiment, the lower semiconductor layer 201 on the semiconductor substrate 100 is formed on the second GaN layer 104. Thus, it is possible to reduce manufacturing costs by manufacturing the LEDs 200 using the semiconductor substrate 100.

On the other hand, during formation of the second GaN layer 104, reaction by-products of Ta and N may be precipitated and in turn negatively influence crystal quality of the lower semiconductor layer 201, active layer 202 and upper semiconductor layer 203 formed thereon. Accordingly, it is desirable that the by-products be removed by evaporation during or after the formation of the second GaN layer 104, as described above in FIG. 1 and the first comparative example.

The reaction by-products may be removed by evaporation during formation of the lower semiconductor layer 201. For example, when the first compound semiconductor layer is grown by MOCVD, the reaction by-products may be removed by evaporation by adjusting a growth temperature, growth pressure, growth speed, and flux of a Ga source of the lower semiconductor layer 210, as in the case of removing the reaction by-products using growth of the second GaN layer 104. Particularly, the reaction by-products may be removed by evaporation by setting the flux of TMGa as the Ga source of the lower semiconductor layer 201 to less than 87 μmol/min.

The upper semiconductor layer 203 is located above a portion of the lower semiconductor layer 201, with the active layer 202 interposed between the upper semiconductor layer 203 and the lower semiconductor layer 201. Further, an upper electrode layer 204 may be formed on the upper semiconductor layer 203. The upper electrode layer 204 may be a transparent electrode layer formed of, for example, indium tin oxide (ITO), Ni/Au, and the like.

Further, an upper electrode pad 205 is formed on the upper electrode layer 204 and a lower electrode 207 is formed on an exposed region of the lower semiconductor layer 201.

After the LEDs 200 are formed on the single semiconductor substrate 100 in this manner, the LEDs 200 are divided into individual LEDs 200 by cutting a portion of the semiconductor substrate 100 between the LEDs 200. In each LED of this embodiment, the upper electrode pad 205 and the lower electrode pad 207 are laterally arranged, but the LED may be fabricated to have vertically arranged electrodes. In other words, a vertical type LED may be fabricated by separating the sapphire substrate 101 using the void 102a of the semiconductor substrate 100, flattening the separated surface of the first GaN layer 102 by RIE or the like, and forming an upper electrode pad 205 and a lower electrode pad 207.

As such, it is possible to reduce manufacturing costs of the LED array by manufacturing the LEDs 200 using the semiconductor substrate 100. Further, when forming the LEDs 200 on the second GaN layer 104, it is possible to construct an LED array with improved luminous efficiency and high brightness by forming the compound semiconductors such that the second GaN layer 104 and the lower semiconductor layer 201 have different indices of refraction from each other. Further, when a laser diode is formed using the semiconductor substrate 100, it is possible to achieve an improvement in heat dissipation properties together with long operational lifetime of the laser diode, since the laser diode is formed on the GaN layer, which exhibits better thermal conductivity than the sapphire substrate 101.

In the second exemplary embodiment, the LEDs 200 are formed on the second GaN layer of the semiconductor substrate 100. Alternatively, the LEDs 200 may be formed in the same manner using the GaN substrate, from which the sapphire substrate 101 is separated.

Therefore, the semiconductor substrate 100 is used to manufacture semiconductor devices such as LEDs or laser diodes, thereby facilitating fabrication of high performance semiconductor devices at low cost without using an expensive GaN substrate.

Next, a method of fabricating a light emitting device via separation of a growth substrate will be described with reference to FIGS. 17(A)-17(E).

FIGS. 17(A)-17(E) illustrate a flow diagram of a method of fabricating a light emitting device according to a third exemplary embodiment.

Figure 17A:
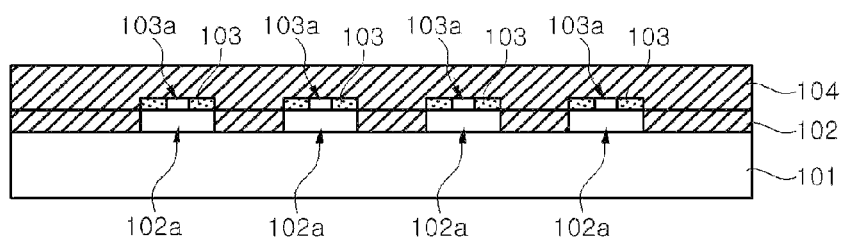
FIG. 17A, FIG. 17B, FIG. 17C, FIG. 17D, and FIG. 17E illustrate a flow diagram of a method of fabricating a light emitting device according to a third exemplary embodiment of the present invention.

Referring to FIG. 17(A), a first GaN layer 102 is grown on a sapphire substrate 101 as a first substrate, and a Ta layer 103 is formed in a shape of stripes on the first GaN layer 102, as described with reference to FIG. 1(A) to FIG. 1(D). Then, a second GaN layer 104 is formed on the first GaN layer 102 and the Ta layer 103. Here, voids 102a are formed in the first GaN layer 102. Further, during formation of the second GaN layer 104, holes 103a may be formed in the Ta layer 103. The holes 103a may be previously formed by patterning before the second GaN layer 104 is formed.

Figure 17B:
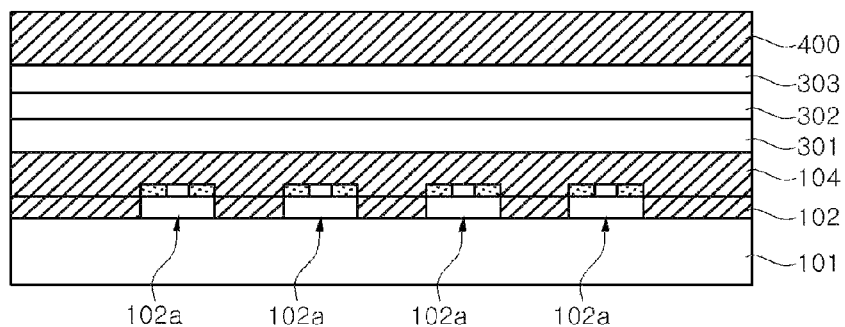

Referring to FIG. 17(B), a first conductive compound semiconductor layer 301, an active layer 302, and a second conductive compound semiconductor layer 303 are sequentially formed on the second GaN layer 104.

The first conductive compound semiconductor layer 301, active layer 302, and second conductive compound semiconductor layer 303 may be gallium nitride-based semiconductors and may be formed by MOCVD. The active layer 302 may have a single or multi-quantum well structure, and may be formed of a material and composition selected depending on a desired light emitting frequency. The first and second semiconductor layers 301 and 303 may be formed of a material having a greater band gap than that of the active layer 302.

Then, a second substrate 400 is attached to the second conductive compound semiconductor layer 303. The second substrate 400 may be a metal substrate having good thermal conductivity or a silicon-based substrate such as Si or SiC. The second substrate 400 may be attached to the second conductive compound semiconductor layer 303 in various ways, for example, via a bonding metal.

Figure 17C:
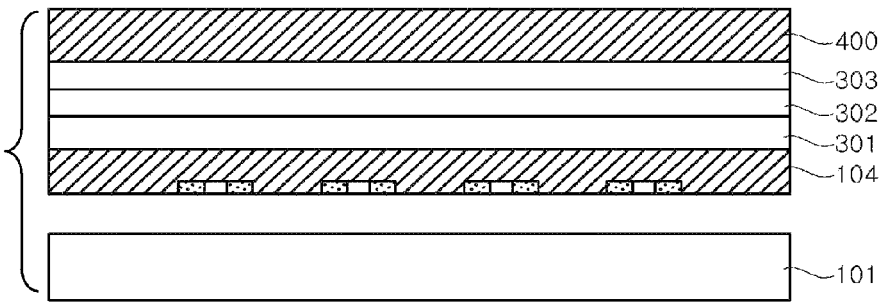

Referring to FIG. 17(C), the sapphire substrate 101 is separated from the second GaN layer 104. The sapphire substrate 101 may be separated from the second GaN layer 104 by etching the first GaN layer 102 using a chemical solution. Although the first GaN layer 102 is shown as being completely removed from an interface between the sapphire substrate 101 and the first GaN layer 102, the present invention is not limited to this configuration and only a portion of the first GaN layer may be removed therefrom. Since the chemical solution and the etching method are the same as those of the first exemplary embodiment illustrated in FIG. 1, a description thereof will be omitted herein.

Alternatively, the sapphire substrate 101 may be separated through growth of the voids 102a. Referring again to FIG. 17(C), the sapphire substrate 101 is heated to grow the voids 102a. Then, adjoining voids 102a meet each other so that the sapphire substrate 101 is separated from the second GaN layer 104. The sapphire substrate 101 may be heated to 300° C. or more, for example, in the range of 900~1100° C.

Heating the sapphire substrate 101 may be performed while attaching the second substrate 400 to the second conductive compound semiconductor layer 303. As a result, the sapphire substrate 101 may be easily separated without using a different process for separating the sapphire substrate 101.

Further, although the adjoining voids 102a are illustrated as meeting each other to allow the sapphire substrate 101 to be separated from the second GaN layer 104, the adjoining voids 102a may not meet each other when the sapphire substrate 101 is heated. In this case, since the voids 102a have a sufficient size, the sapphire substrate 101 may be easily separated by applying force to the sapphire substrate. Here, it is desirable that the voids 102a be grown by heating the sapphire substrate 101 until a lower end of the voids 102a contacts the sapphire substrate 101.

Figure 17D:
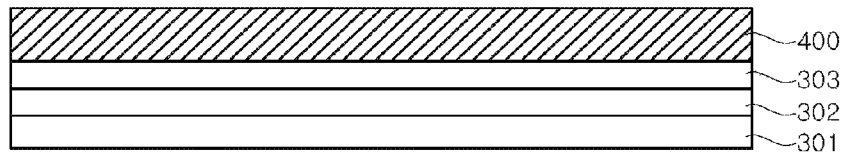

Referring to FIG. 17(D), after the sapphire substrate 101 is separated from the second GaN layer, the separated surface is flattened by RIE or polishing. Here, the first conductive semiconductor layer 301 may be exposed by polishing the second GaN layer 104 to remove the second GaN layer 104. Alternatively, if the second GaN layer 104 is a first conductive semiconductor layer, the second GaN layer 104 may remain.

Figure 17E:
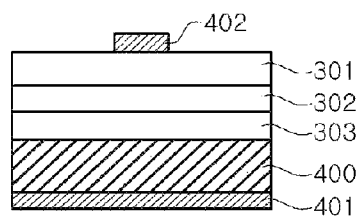

Referring to FIG. 17(E), a lower electrode pad 401 is formed on the second substrate 400 and an upper electrode pad 402 is formed on the surface from which the sapphire substrate was separated. Then, the light emitting devices are divided into individual light emitting devices, thereby completing fabrication of vertical type light emitting devices as shown in FIG. 17(E).

Here, the first conductive semiconductor layer may be a GaN-based n-type compound semiconductor and the second conductive semiconductor layer may be a GaN-based p-type compound semiconductor. Thus, it is possible to form a rough surface on the separated surface, for example, on a surface of the first conductive semiconductor layer 301, by photo electrochemical etching or the like.

Although the method of fabricating a vertical type light emitting device is described in the third exemplary embodiment, a horizontal-type light emitting device may also be fabricated on the second substrate 400 after separation of the sapphire substrate 101, as described in the second exemplary embodiment.

As such, the method according to the present invention allows a growth substrate such as a sapphire substrate to be easily separated without using a laser beam after growing a GaN-based compound semiconductor layers on the sapphire substrate, thereby enabling a reduction in fabrication costs of LEDs. Further, the method according to the present invention does not require polishing of the sapphire substrate, which is performed for a laser lift-off process, so that the sapphire substrate may be used again.

Next, a method of fabricating a light emitting device using an apparatus including a plurality of chambers will be described with reference to FIGS. 18(A)-18(C) and FIG. 19.

Figure 18A:
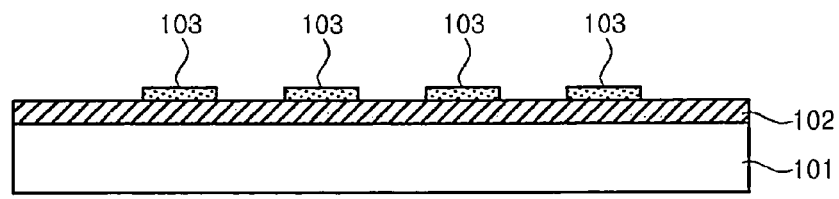
Figure 18B:
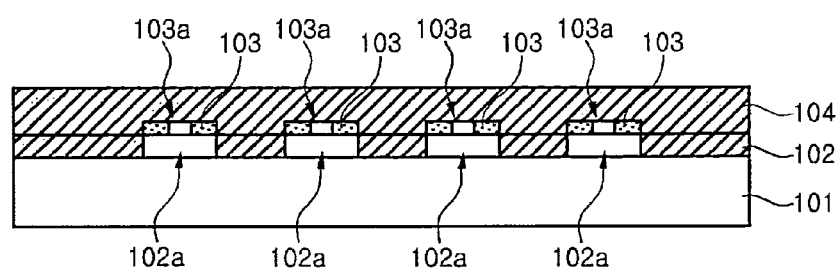
Figure 18C:
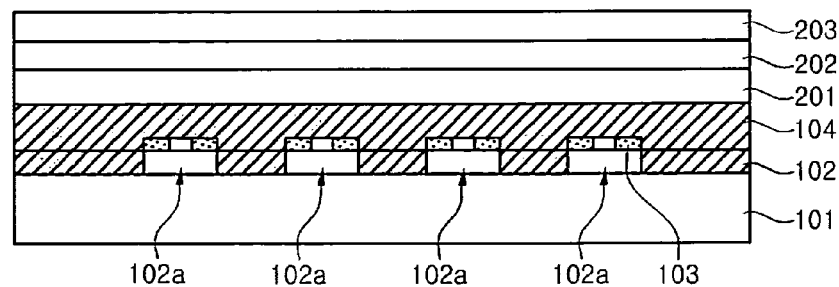
Figure 19:
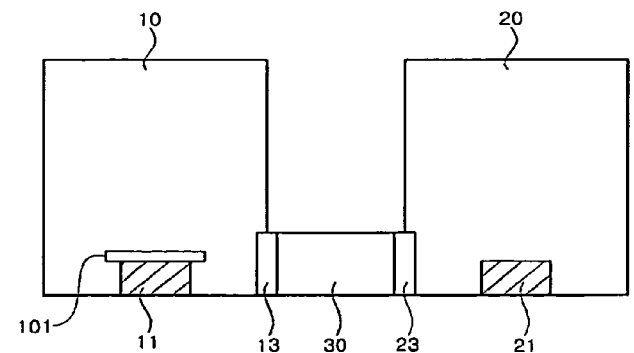
FIG. 19 is a schematic view of an apparatus used for forming a second GaN layer and compound semiconductor layers.

FIGS. 18(A)-18(C) illustrate a flow diagram of a method of fabricating a light emitting device according to a fourth exemplary embodiment, and FIG. 19 is a schematic view of an apparatus for fabricating a light emitting device. FIG. 18(A) is a sectional view of a process of forming a first GaN layer and a metallic material layer; FIG. 18 (B) is a sectional view of a process of forming a second GaN layer and a void; and FIG. 18(C) is a sectional view of a to process of forming compound semiconductor layers.

Referring to FIG. 18(A), reference numeral 101 indicates a sapphire ($Al_2O_3$) substrate. First, a first GaN layer 102 having a thickness of about 2 μm is formed on the sapphire substrate 101. This thickness of the first GaN layer 102 is provided as an example.

Next, a Ta layer (metallic material layer) 103 having a thickness of about 50 nm is formed in a stripe shape, which have a width of 5 μm and are separated a distance of 5 μm from each other, on the first GaN layer 102 by EB deposition and lift-off. The shape, thickness, width, and separation distance of the Ta layer 103 are provided as an example.

Next, in FIG. 18(B), the substrate 101 having the first GaN layer 102 and Ta layer 103 is placed in a first chamber 10 (see FIG. 19), and a second GaN layer 104 is then formed on the first GaN layer 102 and the Ta layer 103 by MOCVD. FIG. 18(B) shows the second GaN layer 104 during formation thereof. In the present exemplary embodiment, N in the first GaN layer 102 combines with Ta to form TaN, which is changed into a different substance and rises towards a vapor phase region in which the concentration of N is relatively high. The TaN becomes unstable at 900° C. or more and is evaporated at 1000° C. or more. As the TaN is evaporated, a hole is deepened to form a void 102a. Here, although N in the first GaN layer 102 becomes TaN, Ga remains in the first GaN layer 102. Since this Ga remaining in the first GaN layer 102 is the same as Ga deposited during the vapor deposition, it is used as the raw material.

The thickness of the second GaN layer 104 may be greater than or equal to one half the thickness of the Ta layer 103. In addition, the second GaN layer 104 may have a thickness less than 1000 μm, but is not limited thereto.

While the second GaN layer 104 is formed by MOCVD, a portion of the first GaN layer 102 under the Ta layer 103 is removed by etching and a formation region of the void 102a is extended substantially to the sapphire substrate 101, as shown in FIG. 18(B). Further, the surface of the substrate is flattened to progress the growth of the first GaN layer 102 along with the growth of the second GaN layer 104, as shown in FIG. 18(B).

As described above, while the second GaN layer 104 is grown, reaction by-products are produced by reaction between Ta and N. Such reaction by-products may contaminate a first chamber 10 and deteriorate crystal quality of compound semiconductors grown in the first chamber 10. Thus, growth of the compound semiconductors may be carried out in a second chamber 20 that is separated from the first chamber 10.

After the growth of the second GaN layer 104 is completed, the substrate 101 is transferred from the first chamber 10 to the second chamber 20 (see FIG. 19). The first chamber 10 is connected to the second chamber 20 via a communication path 30. A shutter 13 may be disposed between the first chamber 10 and the communication path 30 to prevent movement of contaminants from the first chamber 10 to the second chamber 20, and a shutter 23 may also be disposed between the second chamber 20 and the communication path 30 for the same purpose. Although the apparatus is shown as including the shutters 13, 23 between the respective chambers 10, 20 and the communication path 30, the apparatus may include a single shutter in the communication path 30.

Further, each of the chambers 10, 20 is provided with a pedestal 11 or 21 that supports the substrate 101 and includes a heater (not shown) for heating the substrate 101. Although not shown in FIG. 19, each of the chambers 10, 20 is connected to a source line for supplying a source gas and a carrier gas, and to a discharge line for vacuum discharge.

Since the first chamber 10 is connected to the second chamber 20 via the communication path 30, the substrate 101 may be transferred from the first chamber 10 to the to second chamber 20 while remaining under vacuum.

Then, referring to FIG. 18(C), a first compound semiconductor layer 201, active layer 202 and second compound semiconductor layer 203 are formed on the second GaN layer 104 in the second chamber 20.

The compound semiconductor layers 201, 202 and 203 may be formed by MOCVD as in the second GaN layer 104 and may comprise GaN-based compound semiconductors.

Since the compound semiconductors are formed in the second chamber 20 separated from the first chamber 10, it is possible to prevent the crystal quality of the compound semiconductors from being degraded due to reaction by-products produced during formation of the void 102a. Furthermore, since the substrate 101 may be transferred from the first chamber 10 to the second chamber 20 while remaining under vacuum, it is possible to grow the second GaN layer 104 and the compound semiconductor layers 201, 202 and 203 by an in-situ process.

Further, in the fourth exemplary embodiment, since the void 102a is formed in the first GaN layer 102 on the substrate 101, separation of the substrate 101 may be easily achieved using the void 102a.

The LED according to the second exemplary embodiment or the LED according to the third exemplary embodiment may be fabricated using the compound semiconductor layers of the fourth exemplary embodiment, and a detailed description thereof will be omitted herein to prevent repetition.

In the fourth exemplary embodiment, the first and second chambers 10, 20 are separated from each other, thereby preventing deterioration in crystal quality of the compound semiconductor layers by the reaction by-products produced during formation of the void 102a.

In the first, second, third and fourth exemplary embodiments, the Ta layer is formed as the metallic material layer. However, the metallic material layer may be formed of Ta, P, Ni, Cr, any alloy thereof, or any alloy of metals and semiconductors. Further, any metallic material capable of being used for etching the first GaN layer may also be used. Thus, the metallic material may have a higher melting point than a heating temperature at which the second GaN layer 104 is formed.

As apparent from the above description, in the methods according to the exemplary embodiments, a void is formed in a semiconductor layer formed on a growth substrate so that the substrate can be easily removed from the semiconductor layer by etching the semiconductor layer with a chemical solution using the void or by growing the void. Accordingly, it is possible to remove the growth substrate such as a sapphire substrate in the absence of a laser beam, thereby enabling fabrication of semiconductor substrates, such as GaN substrates, or light emitting devices at low cost. Further, the void may be grown by heating the growth substrate in a process such as a process of bonding a second substrate, so that the growth substrate may be separated without an additional process for removing the growth substrate, thereby simplifying the process of fabricating a light emitting device.

In addition, according to the exemplary embodiments, the method enables fabrication of a flat and easily separable GaN substrate on a heterogeneous substrate at low cost while allowing effective removal of reaction by-products. Thus, it is possible to realize performance improvement and long operational lifespan of semiconductor devices, such as LEDs or laser diodes, which are manufactured using the GaN substrate.

Moreover, even in the case where a chamber is contaminated by reaction by-products during formation of the void, a compound semiconductor is grown in a different chamber separated from the chamber where the void is formed. Thus, it is possible to provide the compound semiconductor with good quality.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a light emitting device, the method comprising:
   preparing a plurality of growth chambers;
   preparing a substrate to grow a nitride semiconductor layer;
   growing a first nitride semiconductor layer on the substrate in a first growth chamber;
   growing a second nitride semiconductor layer on the first nitride semiconductor layer; and
   growing compound semiconductor layers on the second nitride semiconductor layer in a second growth chamber connected to the first substrate chamber via a communication path.

2. The method of claim 1, wherein a shutter is disposed between the communication path and the first growth chamber or the second growth chamber.

3. The method of claim 2, wherein the substrate is transferred from the first growth chamber to the second growth chamber while remaining under vacuum.

4. The method of claim 3, wherein the growth of the compound semiconductor layers further comprises growing an active layer.

5. The method of claim 4, wherein the compound semiconductor layers comprise a different material than the first nitride semiconductor layer.

6. The method of claim 5, wherein the growth of the second nitride semiconductor layer produces reaction by-products.

7. The method of claim 6, wherein the first nitride semiconductor layer comprises a GaN layer having a thickness of about 2 μm.

8. The method of claim 7, wherein reaction by-products produced by the growth of the second nitride semiconductor layer contaminates the first growth chamber.

9. The method of claim 6, wherein the second growth chamber is for a metal organic chemical vapor deposition chamber.

10. The method of claim 6, further comprising forming a patterned layer between the first nitride semiconductor layer and the second nitride semiconductor layer.

11. The method of claim 10, wherein the patterned layer comprises a plurality of voids.

12. The method of claim 11, further comprising infiltrating a chemical etchant into the voids.

13. The method of claim 12, further comprising separating the substrate from one of the nitride semiconductor layers.

14. A method of fabricating a light emitting device, the method comprising:
   preparing a plurality of growth chambers;
   preparing a first substrate to grow a nitride semiconductor layer;
   growing a first nitride semiconductor layer on the first substrate in a first growth chamber;
   growing a second nitride semiconductor layer on the first nitride semiconductor layer;
   growing compound semiconductor layers on the second nitride semiconductor layer in a second growth chamber, the second growth chamber being connected to the first growth chamber via a communication path;
   attaching a second substrate on the compound semiconductor layers; and
   separating the first substrate from one of the first and second nitride semiconductor layers.

15. The method of claim 14, further comprising forming a patterned layer between the first nitride semiconductor layer and the second nitride semiconductor layer.

16. The method of claim 15, wherein the patterned layer comprises a plurality of voids.

17. The method of claim 16, wherein the separation of the first substrate comprises infiltrating a chemical etchant into the voids.

18. The method of claim 14, wherein a shutter is disposed between the first growth chamber and the second growth chamber.

19. The method of claim 18, wherein the substrate is transferred from the first chamber to the second chamber while remaining under vacuum.

* * * * *